(12) United States Patent
MatsuMaru et al.

(10) Patent No.: US 8,101,013 B2
(45) Date of Patent: Jan. 24, 2012

(54) FILM-FORMING MATERIAL AND METHOD OF FORMING PATTERN

(75) Inventors: Shogo MatsuMaru, Kawasaki (JP); Hideo Hada, Kawasaki (JP); Shingenori Fujikawa, Saitama-ken (JP); Toyoki Kunitake, Fukuoka-ken (JP)

(73) Assignees: Tokyo Ohka Kogyo Co., Ltd., Kawasaki-shi (JP); Riken, Wako-shi (JP)

( * ) Notice: Subject to any disclaimer, the term of this patent is extended or adjusted under 35 U.S.C. 154(b) by 876 days.

(21) Appl. No.: 11/997,300

(22) PCT Filed: Aug. 24, 2006

(86) PCT No.: PCT/JP2006/316629
§ 371 (c)(1), (2), (4) Date: Jan. 29, 2008

(87) PCT Pub. No.: WO2007/023908
PCT Pub. Date: Mar. 1, 2007

(65) Prior Publication Data
US 2009/0134119 A1 May 28, 2009

(30) Foreign Application Priority Data

Aug. 26, 2005 (JP) ................. 2005-245573
Dec. 26, 2005 (JP) ................. 2005-372022

(51) Int. Cl.
*C09D 5/00* (2006.01)
*C09K 13/00* (2006.01)

(52) U.S. Cl. ............ 106/285; 106/287.1; 106/287.11; 106/287.13; 106/287.17; 106/287.18; 106/287.19; 216/49; 216/67

(58) Field of Classification Search ............ 106/285, 106/287.1, 287.11, 287.13, 287.17, 287.18, 106/287.19; 216/49, 67
See application file for complete search history.

(56) References Cited

U.S. PATENT DOCUMENTS

| | | | |
|---|---|---|---|
| 4,865,649 A | 9/1989 | Kashiwagi et al. | |
| 5,454,861 A * | 10/1995 | Hasegawa et al. | 106/2 |
| 5,496,402 A | 3/1996 | Sakamoto et al. | |
| 6,596,060 B1 * | 7/2003 | Michaud | 106/2 |
| 6,773,498 B1 * | 8/2004 | Groh et al. | 106/287.18 |
| 6,863,923 B1 * | 3/2005 | Kalleder et al. | 427/226 |
| 2002/0051889 A1 | 5/2002 | Kanamori et al. | |
| 2002/0077412 A1 | 6/2002 | Kobayashi et al. | |
| 2004/0058270 A1 | 3/2004 | Iwai et al. | |
| 2004/0139887 A1 * | 7/2004 | Zhang | 106/287.11 |
| 2007/0259106 A1 * | 11/2007 | Shimizu et al. | 427/126.1 |

FOREIGN PATENT DOCUMENTS

| | | |
|---|---|---|
| JP | 63-241076 | 10/1988 |
| JP | 07-097548 | 4/1995 |
| JP | 09-291256 | 11/1997 |
| JP | 10511707 | 11/1998 |
| JP | 11-251310 | 9/1999 |
| JP | 11-279485 | 10/1999 |
| JP | 2001-055554 | 2/2001 |
| JP | 2001-342439 | 12/2001 |
| JP | 2002-241695 | 8/2002 |
| JP | 2003-105266 | 4/2003 |
| JP | 2003-167346 | 6/2003 |
| JP | 2004-325653 | 11/2004 |
| JP | 2005-150222 | 6/2005 |
| JP | 2005-162950 | 6/2005 |
| WO | WO 96/11990 | 4/1996 |

OTHER PUBLICATIONS

JP 11-279485 Machine translation for foreign document (1999).*
International Search Report in connection with corresponding PCT application No. PCT/JP2006/316629, dated Sep. 19, 2006.

* cited by examiner

Primary Examiner — David M Brunsman
(74) Attorney, Agent, or Firm — Knobbe Martens Olson & Bear LLP

(57) ABSTRACT

A film-forming material that is capable of forming, at a low temperature, a film having a high degree of etching resistance and a high etching selectivity ratio relative to an organic film, as well as a method of forming a pattern that uses the film-forming material. The film-forming material includes a metal compound (W) capable of generating a hydroxyl group upon hydrolysis, and a solvent (S) in which the metal compound is dissolved, wherein the solvent (S) includes a solvent (S1) with a boiling point of at least 155° C. that contains no functional groups that react with the metal compound (W). The method of forming a pattern includes the steps of: coating a pattern, which has been formed on top of an organic film of a laminate that includes a substrate and the organic film, using the above film-forming material, and then conducting etching of the organic film using the pattern as a mask.

6 Claims, 1 Drawing Sheet

FILM-FORMING MATERIAL AND METHOD OF FORMING PATTERN

RELATED APPLICATIONS

This application is the U.S. National Phase filing under 35 U.S.C. §371 of PCT/JP2006/316629, filed Aug. 24, 2006, which designated the United States and was published in a language other than English, which claims priority under 35 U.S.C. §119(a)-(d) to Japanese Patent Application No. 2005-245573, filed Aug 26, 2005, and Japanese Patent Application No. 2005-372022, filed Dec. 26, 2005. The content of these applications is incorporated herein by reference in their entireties.

TECHNICAL FIELD

The present invention relates to a film-forming material that is capable of forming a metal oxide film such as a silica ($SiO_2$) film, and a method of forming a pattern.

BACKGROUND ART

Techniques pattern-forming techniques) in which a fine pattern is formed on top of a substrate, and a lower layer beneath that pattern is then fabricated by conducting etching with this pattern as a mask are widely used in the semiconductor industry for IC fabrication and the like, and are attracting considerable attention.

These types of fine patterns are formed from an organic material, and are formed, for example, using a lithography method or a nanoimprint method or the like.

For example, in the case of a lithography method, a resist pattern is formed using a resist composition that contains a resin component.

These resist compositions include positive resist compositions and negative resist compositions. A coating film formed from a positive resist composition is insoluble in alkali developing solutions prior to exposure, but becomes soluble following exposure. A coating film formed from a negative resist composition is soluble in alkali developing solutions prior to exposure, but becomes insoluble following exposure.

As a result, when a pattern is formed using, for example, a positive resist composition, the positive resist composition is applied to a substrate, and then dried to form a coating film (a resist film). Subsequently, this resist film is selectively exposed, and is then developed in an alkali developing solution, thereby removing the exposed portions that have become soluble in the alkali developing solution, and forming a resist pattern.

Using this resist pattern as a mask, a semiconductor or the like is produced by conducting a step in which the substrate is processed by etching. As the etching either wet etching or dry etching may be used, although dry etching is the more widely used (see patent reference 1).

Because these types of patterns are used as masks, they must exhibit excellent etching resistance.

Furthermore, in the type of pattern-forming techniques described above, a BARC (Bottom Anti-Reflective Coating) method is typically employed in which a BARC film with an anti-reflective function is disposed between the above type of substrate and the coating film used for forming the pattern. As the BARC, an organic film (organic BARC) formed from an organic material such as a film-forming resin is typically used. The organic BARC is usually etched using the pattern (the upper layer pattern) formed on top of the BARC, and is subsequently used, together with the upper layer pattern, as the mask for etching the substrate.

In such cases, because the upper layer pattern is used as the mask for conducting etching of the organic BARC, this upper layer pattern must have greater etching resistance than the organic BARC, or in other words, must exhibit a high etching selectivity ratio relative to the organic BARC.

Conventionally, chemical vapor deposition methods (hereafter also referred to as CVD methods) and SOG (spin-on-glass) methods and the like have been used for forming silica based coating films such as $SiO_2$ films. An SOG method is a method in which, generally, a solution (hereafter also referred to as a SOG solution) prepared by dissolving a silicon compound in an organic solvent is applied and then subjected to a heat treatment, thereby forming a film containing $SiO_2$ as the main component (hereafter also referred to as a SOG coating film) (for example, see patent references 2 to 4).

[Patent Reference 1]
Japanese Unexamined Patent Application, First Publication No. 2003-167346
[Patent Reference 2]
Japanese Examined Patent Application, Second Publication No. Hei 8-3074 (Japanese Unexamined Patent Application, First Publication No. Sho 63-241076)
[Patent Reference 3]
Japanese Patent (Granted) Publication No. 2,739,902 (Japanese Unexamined Patent Application, First Publication No. Hei 7-97548)
[Patent Reference 4]
Japanese Patent (Granted) Publication No. 3,228,714 (Japanese Unexamined Patent Application, First Publication No. Hei 11-251310)

DISCLOSURE OF INVENTION

Problems to be Solved by the Invention

Metal oxide films such as the silica-based coating films described above exhibit excellent etching resistance. As a result, metal oxide films can be considered for use as materials for forming patterns. In other words, patterns formed from metal oxide films, and patterns prepared by coating a resist pattern or the like with a metal oxide film can be expected to have a high degree of etching resistance.

However, as far as the inventors of the present invention are aware, a film-forming material capable of forming a metal oxide film that can be used in this type of applications has, until now, failed to exist.

For example, in order to obtain a high-quality metal oxide film with excellent etching resistance using a CVD method or a SOG method, baking at a high temperature of 400° C. or higher is necessary to form a dense metal oxide film, but this type of high-temperature process requires considerable time and cost, and suffers from poor production efficiency.

Particularly in those cases where the surface of a pattern such as a resist pattern is coated, other significant problems arise. Namely, when a metal oxide film is formed on the surface of a very fine pattern, the gaps between adjacent patterns can be buried by the metal oxide film, meaning conducting etching using the pattern as a mask becomes impossible. Furthermore, because a high-temperature treatment is necessary during film formation, maintaining the shape of the pattern being coated is also problematic.

Moreover, in those cases where an organic film such as an organic BARC is provided beneath the pattern, the surface of the organic film within the open portions of the pattern is also coated with the metal oxide film during the formation of the metal oxide film on the pattern surface. As a result, when etching is conducted using the pattern coated with the metal oxide film (the coated pattern) as a mask, etching of the organic film is inhibited by the metal oxide film, which makes it appear that a satisfactory etching selectivity ratio cannot be obtained between the coated pattern and the organic film.

Accordingly, in the above field of pattern formation technology used for carrying out processes in which etching is conducted using a pattern formed on a substrate as a mask, a material that is capable of forming, at low temperature (for example, at room temperature), a film that exhibits a high degree of etching resistance, is unlikely to form on the surface of an organic film present within the open portions of a pattern, and exhibits a high apparent etching selectivity ratio relative to the organic film has been keenly sought. In this description, the expression "etching selectivity ratio relative to an organic film" refers to the apparent etching selectivity ratio between the coated pattern and an organic film when etching is conducted using the coated pattern, which is coated with a metal oxide film, as a mask.

Consequently, an object of the present invention is to provide a film-forming material that is capable of forming, at low temperature, a film having a high degree of etching resistance and a high etching selectivity ratio relative to an organic film, and also to provide a method of forming a pattern that uses the film-forming material.

Means for Solving the Problems

In order to achieve the above object, the present invention adopts the aspects described below.

A first aspect of the present invention is a film-forming material that includes a metal compound (W) capable of generating a hydroxyl group upon hydrolysis, and a solvent (S) in which the metal compound is dissolved, wherein the solvent (S) includes a solvent (S1) with a boiling point of at least 155° C. that contains no functional groups that react with the metal compound (W).

A second aspect of the present invention is a method of forming a pattern that includes the steps of:

coating a pattern, which has been formed on top of an organic film of a laminate that includes a substrate and the organic film, using the film-forming material according to the first aspect above, and conducting etching of the organic film using, as a mask, the pattern that has been coated using the film-forming material.

In this description and within the scope of the appended claims, unless stated otherwise, the term "alkyl group" includes straight-chain, branched-chain and cyclic monovalent saturated hydrocarbon groups. Furthermore, unless stated otherwise, the term "alkylene group" includes straight-chain, branched-chain and cyclic bivalent saturated hydrocarbon groups.

EFFECTS OF THE INVENTION

The present invention is able to provide a film-forming material that is capable of forming, at low temperature, a film having a high degree of etching resistance and a high etching selectivity ratio relative to an organic film, as well as a method of forming a pattern that uses the film-forming material.

DESCRIPTION OF THE REFERENCE SYMBOLS

Figure 1A:
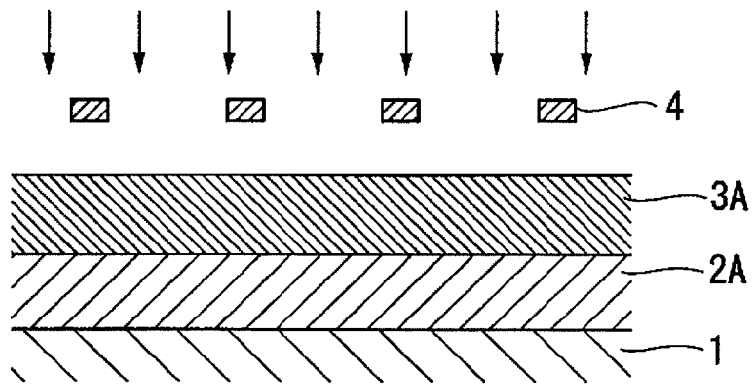
[FIG. 1A] An explanatory diagram showing one example of the sequence within a method of forming a pattern using a film-forming material according to the present invention.

1 Substrate
2A Organic film
2B Organic film pattern
3A Resist film
3B Resist pattern
4 Mask
5 Coating layer

BEST MODE FOR CARRYING OUT THE INVENTION

<<Film-Forming Material>>
[Metal Compound (W)]

The metal compound (W) is a compound capable of generating a hydroxyl group upon hydrolysis.

When a film-forming material containing such a metal compound (W) is applied to a surface (such as the organic film described below), or is applied to a surface and then coated with water, and preferably deionized water, the metal compound (W) reacts with the moisture in the atmosphere or the applied water and generates hydroxyl groups by hydrolysis, even at low temperatures (for example, approximately room temperature). Subsequently, the generated hydroxyl groups undergo a dehydration-condensation, thereby binding a plurality of molecules of the metal compound (W) together, and forming a dense metal oxide film with a high film density (hereafter also referred to as simply a "coating film"). This dense coating film contains a metal oxide, and consequently exhibits excellent etching resistance, and has a high etching selectivity ratio relative to an organic film. Moreover, when the coating film is formed on top of a pattern such as a resist pattern, because the pattern includes reactive groups such as carboxyl groups and hydroxyl groups, these reactive groups within the pattern and the hydroxyl groups generated from the metal oxide (W) react (via dehydration-condensation or adsorption or the like), thus forming a strongly bound coating on the pattern surface.

In the following description, a coating film (a metal oxide film) formed on top of a pattern may also be referred to as a "coating layer".

Examples of compounds that can be used as the metal compound (W) include metal compounds containing a functional group that can generate a hydroxyl group upon hydrolysis.

The functional group is preferably bonded directly to the metal atom.

The number of these functional groups is preferably at least two for each metal atom, is even more preferably within a range from 2 to 4, and is most preferably 4. Ensuring that the compound contains at least two of these functional groups means that the hydroxyl groups generated by hydrolysis undergo dehydration-condensation, thereby binding a plurality of molecules of the metal compound (W) together in a continuous manner to form a strong coating film.

Examples of functional groups that can generate a hydroxyl group upon hydrolysis include alkoxy groups, an isocyanate group, and a carbonyl group. Furthermore, because halogen atoms also have a similar function, halogen atoms are also included within the functional groups of the present invention.

Examples of the alkoxy groups include straight-chain or branched lower alkoxy groups of 1 to 5 carbon atoms such as a methoxy group (—O-Me), ethoxy group (—O-Et), n-propoxy group (—O-nPr), isopropoxy group (—O-iPr), and n-butoxy group (—O-nBu).

Examples of the halogen atoms include a chlorine atom, fluorine atom, bromine atom and iodine atom, although of these, a chlorine atom is preferred.

In those cases where the film-forming material is applied to a pattern to form a coating layer, if reactive groups such as carboxyl groups or hydroxyl groups exist at the pattern surface, then of the above groups, alkoxy groups and an isocyanate group are particularly preferred as they undergo a condensation reaction with these reactive groups. As a result, the hydroxyl groups formed following hydrolysis and the reactive groups on the pattern surface undergo a condensation reaction, thereby binding the coating layer strongly to the pattern surface.

In those cases where the film-forming material is applied to a pattern to form a coating layer, if reactive groups such as carboxyl groups or hydroxyl groups exist at the pattern surface, then of the above groups, a carbonyl group and halogen atoms are particularly preferred as they adsorb to the reactive groups. As a result, the hydroxyl groups formed following hydrolysis and the reactive groups on the pattern surface undergo adsorption, thereby binding the coating layer strongly to the pattern surface.

Of the above groups, an isocyanate group and halogen atoms (and particularly a chlorine atom) are preferred, as they exhibit a high level of activity and can readily form a coating even without conducting a heat treatment, and of these, an isocyanate group is particularly desirable.

In the present invention, metals that can be used within the metal compound (W) include not only typical metals, but also boron, silicon, germanium, antimony, selenium, and tellurium and the like.

Examples of preferred metals for forming the metal compound (W) include titanium, zirconium, aluminum, niobium, silicon, boron, lanthanide, yttrium, barium, cobalt, iron, zirconium and tantalum, and of these titanium and silicon are particularly preferred, and silicon is the most desirable.

Furthermore, the number of metal atoms within the metal compound (W) may be either one, or two or greater, although one atom is preferred.

The metal compound (W) may also include other atoms or organic groups besides the "functional group that can generate a hydroxyl group upon hydrolysis" described above. Other atoms include, for example, a hydrogen atom. Other organic groups include, for example, alkyl groups (and preferably lower alkyl groups of 1 to 5 carbon atoms), and an ethyl group or methyl group is preferred.

Examples of the metal compound (W) include the compounds listed below.

Examples of metal compounds containing an alkoxy group (hereafter also referred to as "metal alkoxides") include the compounds below.

For example, metal alkoxide compounds of metals other than rare earth metals, such as titanium butoxide (Ti(O-nBu)$_4$), zirconium propoxide (Zr(O-nPr)$_4$), aluminum butoxide (Al(O-nBu)$_3$), niobium butoxide (Nb(O-nBu)$_5$), silicon tetramethoxide (Si(O-Me)$_4$), and boron ethoxide (B(O-Et)$_3$);

metal alkoxide compounds of rare earth metals, such as lanthanide isopropoxide (Ln(O-iPr)$_3$) and yttrium isopropoxide (Y(O-iPr)$_3$);

double alkoxide compounds such as barium titanium alkoxide (BaTi(OR$^{60}$)x) (wherein, R$^{60}$ represents a lower alkyl group of 1 to 5 carbon atoms, and X represents an integer from 2 to 4);

metal alkoxide compounds containing two or more alkoxy groups and an organic group other than an alkoxy group, such as methyltrimethoxysilane (MeSi(O-Me)$_3$) and diethyldiethoxysilane (Et$_2$Si(O-Et)$_2$); and metal alkoxide compounds containing a ligand such as acetylacetone, and two or more alkoxy groups, are mentioned.

Furthermore, fine particles of alkoxide sols or alkoxide gels obtained by adding a small quantity of water to one of the above metal alkoxides to effect a partial hydrolysis and condensation can also be used.

Moreover, binuclear or cluster-type alkoxide compounds containing a plurality of metal atoms or a plurality of different metal elements, such as titanium butoxide tetramer (C$_4$H$_9$O[Ti(OC$_4$H$_9$)$_2$O]$_4$ C$_4$H$_9$), and polymers based on metal alkoxide compounds, which have undergone one-dimensional cross-linking via oxygen atoms, are also included within the above metal alkoxides.

Examples of metal compounds containing an isocyanate group include compounds containing two or more isocyanate groups, as represented by the general formula M(NCO)$_x$ (wherein, M represents a metal atom, and X represents an integer from 2 to 4).

Specific examples include tetraisocyanatosilane (Si(NCO)$_4$), titanium tetraisocyanate (Ti(NCO)$_4$), zirconium tetraisocyanate (Zr(NCO)$_4$), and aluminum triisocyanate (Al(NCO)$_3$).

Examples of metal compounds containing a halogen atom include halogenated metal compounds containing two or more (and preferably from 2 to 4) halogen atoms, as represented by the general formula M(X$_1$)$_n$ (wherein, M represents a metal atom, X$_1$ represents one type of atom selected from amongst a fluorine atom, chlorine atom, bromine atom and iodine atom, and n represents an integer from 2 to 4).

The compound containing a halogen atom may also be a metal complex.

Specific examples include tetrachlorotitanium (TiCl$_4$) and tetrachlorosilane (SiCl$_4$). An example of a metal complex is cobalt chloride (CoCl$_2$).

Examples of metal compounds containing a carbonyl group include metal carbonyl compounds such as titanium oxoacetylacetate(TiO(CH$_3$COCH$_2$COO)$_2$) and pentacarbonyl iron (Fe(CO)$_5$), as well as polynuclear clusters of these compounds.

Amongst the above compounds, silicon compounds containing two or more (and preferably from 2 to 4) isocyanate groups and/or halogen atoms are particularly preferred, as they exhibit a high level of activity, and can readily form a metal oxide film with superior etching resistance even without conducting a heat treatment.

The number of silicon atoms within each molecule of this silicon compound may be either one, or two or greater, although one atom is preferred. Of these compounds, compounds represented by a general formula (S-1) shown below are preferred.

$$SiW_a \hspace{4cm} \text{(S-1)}$$

[wherein, a represents an integer from 2 to 4, W represents an isocyanate group (an NCO group) or a halogen atom, and the plurality of W groups may be either the same or mutually different]

In the formula (S-1), a represents an integer from 2 to 4, and is most preferably 4.

W represents an isocyanate group or a halogen atom, and examples of the halogen atom include the same atoms listed above, although a chlorine atom is preferred. Of these, an isocyanate group is particularly preferred.

The metal compound (W) may be used as either a single compound, or a mixture of two or more different compounds.

[Solvent (S)]

A film-forming material of the present invention is a material in which the metal compound (W) is dissolved in a solvent (S), and the solvent (S) must include a solvent (S1) with a boiling point of at least 155° C. that contains no functional groups that react with the metal compound (W). As a result, film portions that exhibit a high degree of etching resistance and a high etching selectivity ratio relative to an organic film can be formed at low temperature.

Although the reasons for this phenomenon are not entirely clear, it is thought that by including the high boiling point solvent (S1) that does not react with the metal compound (W), the solvent (S) remains within the valley portions between adjacent patterns and undergoes almost no volatilization in the period from when the film-forming material is applied to the surface of a pattern or the like until the metal compound (W) undergoes hydrolysis to generate a film.

In other words, during the process of conducting etching using the pattern formed on the substrate as a mask, in those cases where the pattern is formed on an organic film of a laminate that includes a substrate and the organic film, if, following the application of the film-forming material to the pattern to form a coating film, the solvent within the coating does not exist on the upper surface of the pattern, or alternatively does not exist on the upper surface or side surfaces of the pattern, but does exist on top of the organic film, then at the upper surface of the pattern, or alternatively at the upper surface and side surfaces of the pattern, the metal compound (W) undergoes hydrolysis under the action of moisture within the atmosphere, thereby causing chemical adsorption to the pattern surface or generating an oxide, whereas the metal compound (W) on top of the organic film does not undergo hydrolysis, but rather remains in a state where it can be removed by washing with a solvent. In contrast, it is thought that if the solvent volatilizes not only from the pattern surface, but also from the top of the organic film, before the metal compound (W) hydrolyzes to form a coating, then the metal compound (W) will adsorb physically not only to the pattern surface, but also to the surface of the organic film, meaning chemical adsorption and/or formation of a metal oxide film will also occur at the surface of the organic film, thereby lowering the apparent etching selectivity ratio of the coating relative to the organic film. In the present invention, it is surmised that volatilization of the solvent (S) is controlled by including the solvent (S1), thereby addressing the problems outlined above.

In particular, if the film-forming material is applied to the organic film with a pattern formed thereon, and the surface of the pattern and the organic film are then washed in the manner described below, then the etching selectivity ratio of the pattern relative to the organic film improves even further. It is surmised that this observation is due to the fact that because the solvent (S) remains within the valley portions between adjacent patterns and undergoes almost no volatilization in the period prior to washing, the metal compound (W) on the surface of the pattern, which has undergone comparatively strong adhesion via chemical adsorption and the like, remains adhered to the pattern even when subjected to washing, whereas the metal compound (W) on the surface of the organic film, which is adhered comparatively weakly, is removed by the washing process, and that as a result, almost no metal oxide film is formed on the surface of the organic film.

As the solvent (S1), any solvent that contains no functional groups that react with the metal compound (W), has a boiling point of at least 155° C., and is capable of dissolving the metal compound (W) can be used, and the solvent may be selected from conventional organic solvents.

Example of functional groups that react with the metal compound (W) include groups containing a carbon-carbon double bond such as a vinyl group, as well as a hydroxyl group, carboxyl group and halogen atoms. Provided the solvent contains none of these functional groups, the metal compound (W) exists stably within the solvent (S), yielding excellent film forming capabilities.

The boiling point of the solvent (S1) is preferably at least 160° C., and is even more preferably 165° C. or higher. Furthermore, although there are no particular restrictions on the upper limit for the boiling point, from the viewpoint of factors such as the coating properties, the boiling point is preferably not more than 300° C., and is even more preferably 250° C. or lower.

The solvent (S1) is preferably an aliphatic compound, as such compounds yield superior effects for the present invention.

In this description, the term "aliphatic" is a relative concept used in relation to the term "aromatic", and defines a group or compound or the like that contains no aromaticity. The term "aliphatic compound" describes a compound that contains no aromaticity.

The aliphatic compound may be either a chain-like compound that contains no rings within the structure, or a cyclic compound that contains a ring within the structure, and a cyclic compound is preferred. Furthermore, the cyclic compound is preferably a hydrocarbon, and is most preferably a saturated hydrocarbon.

Examples of this type of cyclic compound include monocycloalkanes, polycycloalkanes such as bicycloalkanes, tricycloalkanes and tetracycloalkanes, and compounds in which a substituent group such as an alkyl group is bonded to a ring of one of these compounds.

Furthermore, as the solvent (S1), selection of a solvent that has minimal impact on the environment is also preferred.

Examples of this type of solvent include solvents for which the starting raw materials are natural materials.

Examples of solvents for which the starting raw materials are natural materials include terpene-based solvents (including monocyclic monoterpenes such as p-menthane, o-menthane and m-menthane, and bicyclic monoterpenes such as pinane, which are described below) obtained from essential oil component of plants.

Moreover, in those cases where the film-forming material of the present invention is used as a pattern coating material within a process for conducting etching using a pattern (such as a resist pattern) formed on top of a substrate as a mask, the solvent (S1) is preferably selected so as not to dissolve the pattern. By selecting such a solvent, the pattern shape is less likely to deteriorate during formation of the coating layer on the pattern surface using the film-forming material of the present invention.

As the solvent (S1), compounds represented by a general formula (s-1) shown below (hereafter also referred to as the compound (s-1)) are particularly preferred, as they do not react with the metal compound (W), yield superior effects for the present invention, have minimal impact on the environment, and do not dissolve resist patterns.

[Formula 1]

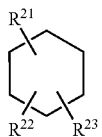

(s-1)

[wherein, $R^{21}$ to $R^{23}$ each represent, independently, a hydrogen atom or a straight-chain or branched alkyl group, at least two of $R^{21}$ to $R^{23}$ represent alkyl groups, and those alkyl groups may be bonded to a carbon atom within the cyclohexane ring other than the carbon atom to which the alkyl group is bonded, thereby forming a ring]

In the formula (s-1), of the groups $R^{21}$ to $R^{23}$, at least two groups are straight-chain or branched alkyl groups. In other words, in the compound (s-1), either two of the groups $R^{21}$ to $R^{23}$ may be straight-chain or branched alkyl groups, with the other group being a hydrogen atom, or all of the groups $R^{21}$ to $R^{23}$ may be straight-chain or branched alkyl groups. In the present invention, compounds in which two of the groups $R^{21}$ to $R^{23}$ are straight-chain or branched alkyl groups are preferred.

The straight-chain or branched alkyl groups represented by $R^{21}$ to $R^{23}$ are preferably lower alkyl groups of 1 to 5 carbon atoms, and are even more preferably alkyl groups of 1 to 3 carbon atoms. Specific examples include a methyl group, ethyl group, propyl group, isopropyl group, n-butyl group, isobutyl group, pentyl group, isopentyl group, and neopentyl group. Of these, a methyl group or isopropyl group is preferred.

The two or more alkyl groups represented by $R^{21}$ to $R^{23}$ may be either the same or different.

In the present invention, at least one of the groups $R^{21}$ to $R^{23}$ is preferably a branched alkyl group, and compounds in which one of the groups is an isopropyl group are particularly preferred.

Compounds containing both an isopropyl group and a methyl group are particularly desirable as the compound (s-1).

The alkyl groups represented by $R^{21}$ to $R^{23}$ may be bonded to a carbon atom within the cyclohexane ring other than the carbon atom to which the alkyl group is bonded, thereby forming a ring.

Here, the description that the alkyl group may be "bonded to a carbon atom within the cyclohexane ring other than the carbon atom to which the alkyl group is bonded, thereby forming a ring" means that a group produced by removing a single hydrogen atom from the alkyl group (namely, an alkylene group) links the carbon atom on the cyclohexane ring to which the alkyl group is bonded, and another carbon atom.

There are no particular restrictions on the bonding positions of $R^{21}$ to $R^{23}$, although compounds in which at least two alkyl groups are bonded to either positions 1 and 4 (the para position) or positions 1 and 3 (the meta position) of the cyclohexane ring are preferred.

Specific examples of the compound represented by the formula (s-1) include p-menthane (boiling point: approximately 170° C.), m-menthane (boiling point: approximately 170° C.), o-menthane (boiling point: approximately 170° C.), and pinane (boiling point: approximately 169° C.). The structures of these compounds are shown below.

In the present invention, the case in which the solvent (S1) is p-menthane is particularly preferred, as it results in superior effects for the present invention.

[Formula 2]

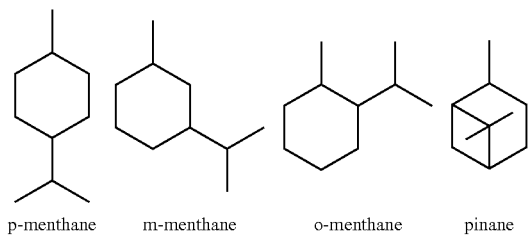

p-menthane    m-menthane    o-menthane    pinane

The solvent (S1) may be used as either a single compound, or a mixture of two or more different compounds.

The proportion of the solvent (S1) within the solvent (S) is preferably within a range from 50 to 100% by weight, is even more preferably from 80 to 100% by weight, and is most preferably 100% by weight.

In the present invention, the solvent (S) may also include a solvent (S2) other than the solvent (S1), provided inclusion of this other solvent does not impair the effects of the present invention.

Examples of the solvent (S2) include methanol, ethanol, propanol, n-hexane, n-heptane, toluene, benzene and cumene, and from the viewpoint of enabling formation of a dense film, n-heptane (boiling point: approximately 98° C.) and cumene (boiling point: approximately 152° C.) are preferred.

The solvent (S2) may be used as either a single compound, or a mixture of two or more different compounds.

There are no particular restrictions on the quantity used of the solvent (S), although the quantity is preferably sufficient to generate a molar concentration within the film-forming material (the concentration of the combination of the metal compound (W) and any other organic compounds described below, which may be used according to need) within a range from approximately 1 to 200 mM, even more preferably from 50 to 150 mM, and most preferably from 50 to 100 mM. Ensuring a molar concentration within this range enables the formation of a more uniform film, and is consequently preferred.

[Optional Components]

Other optional components may also be added to the film-forming material in addition to the metal compound (W) and the solvent (S).

Examples of these optional components include organic compounds. Adding such compounds means composite films of the metal oxide and the organic compound can be formed.

There are no particular restrictions on the organic compound, provided it dissolves in the solvent (S) described above.

Here, the term "dissolves" is not limited to those cases in which the lone organic compound dissolves in isolation, but also includes cases such as 4-phenylazobenzoic acid, which dissolves in solvents such as chloroform upon formation of a complex with a metal alkoxide.

There are no particular restrictions on the molecular weight of the organic compound.

From the viewpoints of further increasing the coating strength and the adhesion of the coating film to the pattern, the use of an organic compound that contains a plurality of reactive groups (preferably hydroxyl groups or carboxyl groups) and is a solid at room temperature (25° C.) is preferred.

Examples of this type of organic compound that can be used favorably include polymer compounds containing hydroxyl groups or carboxyl groups such as polyacrylic acid, polyvinyl alcohol, polyvinylphenol, polymethacrylic acid and polyglutamic acid; polysaccharides such as starch, glycogen, and colominic acid, disaccharides and monosaccharides such as glucose and mannose, and porphyrin compounds and dendrimers and the like that contain hydroxyl groups or carboxyl groups at the terminals.

Furthermore, cationic polymer compounds can also be used favorably as the organic compound. Metal alkoxides and metal oxides can undergo an anionic interaction with the cations of cationic polymer compounds, enabling strong bonds to be realized.

Specific examples of cationic polymer compounds include PDDA (polydimethyldiallylammonium chloride), polyethyleneimine, polylysine, chitosan, and dendrimers containing amino groups at the terminals.

These organic compounds function as structural components for forming thin films with a high degree of mechanical strength. Furthermore, the organic compounds can also perform the roles of a functional site for imparting functionality to the resulting thin film, or as a component for forming a void within the thin film that matches the molecular shape of the organic compound, by removing the compound following film formation.

The organic compound may be used as either a single compound, or a mixture of two or more different compounds.

In those cases where an organic compound is added, the blend quantity is preferably within a range from 0.1 to 50 parts by weight, and even more preferably from 1 to 20 parts by weight, per 100 parts by weight of the metal compound (W).

Because the film-forming material of the present invention can form a film which exhibits a high degree of etching resistance and can be formed at low temperature, it is useful as a pattern coating material for use within a process for conducting etching using a pattern formed on a substrate as a mask.

In other words, silica films have conventionally been formed using methods that require a high-temperature treatment, such as SOG methods, but if these methods are applied to the process described above, then the high-temperature treatment will cause heat sag of the pattern being coated. In contrast, because the film-forming material of the present invention is capable of forming a metal oxide film at low temperature, the film-forming material can be used to form a coating layer with a high degree of etching resistance without causing any deterioration in the shape of the pattern being coated.

Examples of the pattern being coated include patterns formed by nanoimprinting and resist patterns formed using a resist composition, although from the viewpoint of enabling microfabrication, a resist pattern is preferred.

The film-forming material of the present invention can be used particularly favorably in those cases where the above pattern is formed on top of an organic film of a laminate that includes a substrate and the organic film. In other words, the film-forming material of the present invention can be used particularly favorably in a method of forming a pattern according to the present invention described below.

This is because a coating pattern is obtained that exhibits an excellent etching selectivity ratio relative to the organic film, and by conducting etching using this coating pattern as a mask, the organic film can be etched with no deterioration in the shape of the pattern. As a result, a pattern with a high aspect ratio can be formed, which is desirable.

The aspect ratio is represented by the ratio of the pattern height relative to the pattern width at the bottom of the pattern (at the substrate side).

Furthermore, in terms of efficiency, the etching of the above organic film is preferably conducted using either oxygen plasma etching, or etching that uses $CF_4$ gas or $CHF_3$ gas. The film-forming material of the present invention exhibits favorable etching resistance relative to these etching methods. Of the above methods, oxygen plasma etching is preferred.

<<Method of Forming Pattern>>

The method of forming a pattern according to the present invention includes the steps of: coating a pattern, which has been formed on top of an organic film of a laminate that includes a substrate and the organic film, using the film-forming material according to the present invention, and conducting etching of the organic film using, as a mask, the pattern that has been coated using the film-forming material.

With the exception of using the film-forming material of the present invention, each of these steps can be conducted using conventional methods.

The pattern that is coated by the film-forming material can be formed using conventional pattern-forming techniques such as imprinting methods and lithography methods. Lithography methods are particularly preferred as they enable the formation of very fine patterns with a high level of precision.

As mentioned above, examples of the pattern include patterns formed by nanoimprinting and resist patterns formed using a resist composition, although a resist pattern is preferred.

A preferred example of the method of forming a pattern according to the present invention is described below in sequence, using FIG. 1A through FIG. 1D.

Figure 1B:
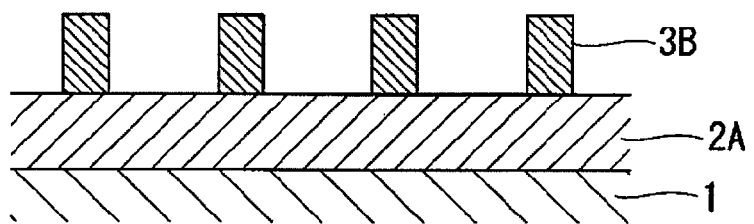
[FIG. 1B] An explanatory diagram showing one example of the sequence within a method of forming a pattern using a film-forming material according to the present invention.
Figure 1C:
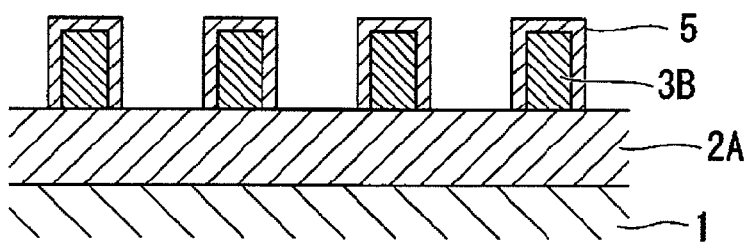
[FIG. 1C] An explanatory diagram showing one example of the sequence within a method of forming a pattern using a film-forming material according to the present invention.
Figure 1D:
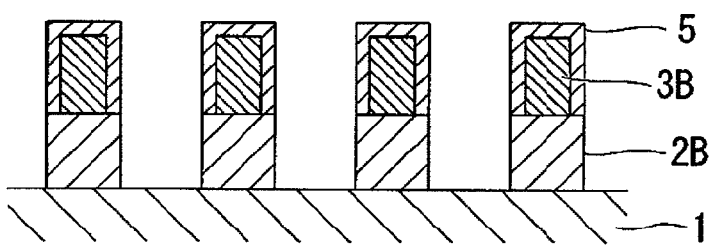
[FIG. 1D] An explanatory diagram showing one example of the sequence within a method of forming a pattern using a film-forming material according to the present invention.

FIG. 1A through FIG. 1D are diagrams showing one example of the sequence within the method of forming a pattern according to the present invention. In this example, the method of forming a pattern includes:

a step of forming an organic film 2A on top of a substrate 1 to produce a laminate, as shown in FIG. 1A (hereafter this step is referred to as the laminate formation step), a step of forming a resist film 3A on top of the organic film 2A of the produced laminate, and then selectively exposing and developing the resist film 3A, thereby forming a resist pattern 3B as shown in FIG. 1B (hereafter this step is referred to as the resist pattern formation step), a step of forming a coating layer 5 on top of the resist pattern 3B using the film-forming material of the present invention, as shown in FIG. 1C (hereafter this step is referred to as the coating layer formation step), and a step of etching the underlying organic film 2A using, as a mask, the resist pattern 3B that has been coated with the coating layer 5, thereby forming an organic film pattern 2B as shown in FIG. 1D (hereafter this step is referred to as the etching step).

As follows is a more detailed description of each of the steps.

[Laminate Formation Step]

First, as shown in FIG. 1A, the organic film 2A is formed on top of the substrate 1.

There are no particular restrictions on the substrate 1, and conventional substrates can be used, including substrates for electronic componentry, as well as substrates on which a predetermined wiring pattern has already been formed. Specific examples of suitable substrates include silicon wafers, metal-based substrates such as copper, chrome, iron, and aluminum, as well as glass substrates. Suitable materials for the wiring pattern include copper, aluminum, nickel, and gold.

The organic film 2A can be formed, for example, by using a spinner or the like to apply an organic film material, prepared by dissolving a resin component or the like in an organic solvent, to the surface of the substrate 1, and then conducting a bake treatment under conditions that include heating at a temperature that is preferably within a range from 200 to 300° C., for a period of 30 to 300 seconds, and preferably for 60 to 180 seconds.

The thickness of the organic film 2A is preferably within a range from 10 to 500 nm, and is even more preferably from 50 to 450 nm. Ensuring a thickness within this range yields favorable effects, such as enabling the formation of a pattern with a high aspect ratio, and ensuring that a satisfactory level of etching resistance is obtained.

The organic film material is described below.

[Resist Pattern Formation Step]

Subsequently, the resist film 3A is formed on top of the organic film 2A of the thus formed laminate containing the substrate 1 and the organic film 2A.

The resist film 3A can be formed, for example, by using a spinner or the like to apply a resist composition to the surface of the organic film 2A, and then conducting a prebake under temperature conditions within a range from 80 to 150° C., for a period of 40 to 120 seconds, and preferably for 60 to 90 seconds.

The thickness of the resist film 3A is preferably within a range from 50 to 500 nm, and is even more preferably from 50 to 450 nm. Ensuring a thickness within this range yields favorable effects, such as enabling the formation of a resist pattern at a high resolution, and ensuring that a satisfactory level of resistance to etching is obtained.

The materials for the resist composition are described below.

Subsequently, exposure is conducted through a mask 4 from the side of the resist film 3A, and PEB (post exposure baking) is conducted under temperature conditions within a range from 80 to 150° C., for a period of 40 to 120 seconds, and preferably for 60 to 90 seconds. If alkali developing is then conducted using, for example, an aqueous solution of tetramethylammonium hydroxide (TMAH) with a concentration of 0.1 to 10% by weight, then the exposed portions are removed, thereby forming the resist pattern 3B on top of the organic film 2A, as shown in FIG. 1B.

[Coating Layer Formation Step]

Subsequently, as shown in FIG. 1C, the coating layer 5 is formed on top of this resist pattern 3B using the film-forming material of the present invention.

Specifically, the film-forming material is applied to the surface of the resist pattern 3B, and following formation of a coating film, the coating film is washed with an organic solvent, and the coating film is then dried to form the coating layer 5. In other words, by conducting washing following the formation of the coating film, the excess metal compound (W) (such as the metal compound (W) adhered to the organic film) is removed, and during the subsequent period until drying is complete, the metal compound (W) within the coating film gradually hydrolyzes to form hydroxyl groups under the action of moisture within the air, and these hydroxyl groups then undergo a dehydration-condensation, thereby forming a coating film of a metal oxide (the coating layer 5) on the surface of the resist pattern 3B. In those cases where the film-forming material includes organic matter, a composite coating film of the organic matter and the metal oxide is formed. According to the above method, the film can be formed at a low temperature (for example, room temperature).

During this process, if the resist pattern 3B contains reactive groups (preferably hydroxyl groups or carboxyl groups), then these reactive groups and the functional groups of the metal compound (W) contained within the film-forming material either react or adsorb, thereby favorably strengthening the bonding between the resist pattern 3B and the coating layer 5.

From the viewpoint of controlling the reactivity, the operation of forming the coating layer 5 is preferably conducted under an inert gas atmosphere. In such a case, the treatment must be conducted without employing the moisture within the air.

The method used for applying the film-forming material can employ a conventional method, and examples of suitable methods include a method in which the laminate with the resist pattern 3B formed thereon is immersed in the film-forming material (a dip coating method), and a method in which the film-forming material is applied to the resist pattern 3B using a spin coating method. Furthermore, the coating film may also be formed using methods such as an alternate adsorption method.

The temperature during application of the film-forming material to the surface of the resist pattern 3B (the coating temperature) differs depending on the activity of the metal compound (W) being used, and cannot be readily generalized, but is typically set within a range from 0 to 100° C.

Furthermore, the time elapsed from application of the film-forming material to the resist pattern 3B until drying (including application, washing, and if necessary, other treatments such as adsorption), namely the contact time between the pre-hydrolysis coating film and the resist pattern 3B, and the temperature (the contact temperature) during that time period differ depending on the activity of the metal compound (W) being used, and cannot be readily generalized, although generally, the time period is within a range from several seconds to several hours, or more specifically from one second to two hours, and the temperature is usually set within the same range as that specified above for the coating temperature.

As the organic solvent used for washing, the same solvents as those exemplified above for the solvent (S) of the film-forming material can be used.

Washing can be conducted favorably using, for example, a method in which the organic solvent is supplied to the surface of the coating film formed from the film-forming material using a spraying method or the like, and the excess organic solvent is then suctioned off under reduced pressure, a method in which the coating film is washed by immersion in the organic solvent, a spray cleaning method, or a steam cleaning method.

The temperature conditions during washing preferably employ the same temperature as that used during the operation of applying the film-forming material.

In the present invention, by applying the film-forming material to the surface of the resist pattern 3B, and subsequently conducting washing to remove the excess metal compound (W) from the top of the resist pattern 3B and the organic film 2A, a film with excellent uniformity of film thickness can be formed. In other words, by conducting washing, the metal compound (W) that is adsorbed only via weak physical adsorption is removed, whereas the chemically adsorbed metal compound (W) remains in a uniform layer on the surface of the resist pattern 3B, meaning a very thin film at the nanometer level can be formed with a uniform film thickness, at an extremely high level of precision, and with excellent reproducibility. Accordingly, the above washing operation is particularly effective in those cases where chemical adsorption has occurred between the resist pattern 3B and the metal compound (W).

Moreover, by conducting washing, the coating layer 5 develops a superior etching selectivity ratio relative to the organic film 2A. In other words, because the organic film materials typically used for organic BARC and the like contain almost no reactive groups such as hydroxyl groups, chemical adsorption with the metal compound (W) is unlikely. In contrast, resist patterns include a comparatively large quantity of reactive groups such as hydroxyl groups, and therefore undergo chemical adsorption much more readily. However, physical adsorption can occur to either of the layers, and if washing is not conducted, then there is a danger that the excess metal compound (W) will form a coating layer on the surface of the organic film 2A, thereby causing a reduction in the etching selectivity ratio. However, by conducting the washing operation, formation of a coating layer on the surface of the organic film 2A becomes much less likely, thereby improving the etching selectivity ratio.

In the description of the present invention, the term "chemical adsorption" describes the state where chemical bonds (covalent bonds, hydrogen bonds or coordination bonds or the like) or electrostatic bonds (such as ion bonds) are formed between the reactive groups (and preferably hydroxyl groups or carboxyl groups) that exist on the surface of the resist pattern 3B or the organic film 2A and the metal compound (W), so that the metal compound (W) or metal ions thereof are bonded to the surface of the resist pattern 3B or the organic film 2A.

Furthermore, the term "physical adsorption" describes the state where the metal compound (W) or metal ions thereof are bonded to the surface of the resist pattern 3B or the organic film 2A via weak intermolecular forces such as van der Waals forces.

Following washing, the film surface is dried. There are no particular restrictions on the drying method, and conventional methods can be used. For example, a drying gas such as nitrogen gas may be used, or in those cases where application of the film-forming material is conducted using a spinner, drying may also be conducted by spin drying.

In this step, if required, a treatment such as a standing period may be introduced following application of the film-forming material and before drying is conducted, in order to promote the chemical adsorption and/or physical adsorption between the resist pattern 3B and the metal compound (W) within the coating film.

In the present invention, a hydrolysis treatment may be conducted in the period following washing of the film-forming material and before drying is conducted, by bringing the coating film into contact with water, thereby causing hydrolysis of the metal compound (W) on the film surface, and generating hydroxyl groups at the film surface. This operation facilitates the formation of a coating layer in which a plurality of coating films are laminated on top of one other, enabling the thickness of the coating layer 5 to be adjusted in the manner described below. In other words, the hydroxyl groups generated at the surface of the coating film and the metal compound (W) within the coating film formed by applying additional film-forming material react to generate a powerful bond, meaning a coating layer in which a plurality of coating films are laminated on top of one other can be obtained.

The method used for conducting the hydrolysis treatment can employ conventional methods without any particular restrictions. For example, a sol-gel method in which the coating film is brought into contact with water is the most common. More specific examples include methods in which water is applied to the surface of the coating film, and methods in which the laminate containing the formed coating film is immersed within an organic solvent containing a small quantity of water.

In those cases where the film-forming material contains a compound that exhibits high reactivity relative to water as the metal compound (W), leaving the coating film to stand in the atmosphere causes the metal compound (W) to hydrolyze by reacting with the water vapor in the atmosphere, meaning a separate hydrolysis treatment is unnecessary.

In order to prevent the introduction of impurities and the like, and enable generation of a metal oxide of high purity, deionized water is preferably used as the water.

Furthermore, in the hydrolysis treatment, the time required for completing the treatment can be significantly reduced by using a catalyst such as an acid or a base.

The thickness of the coating layer 5 is preferably at least 0.1 nm, is even more preferably within a range from 0.5 to 50 nm, and is most preferably from 1 to 30 nm. By ensuring the thickness is at least 0.1 nm but not more than 50 nm, favorable resistance to etching, and particularly dry etching, can be achieved.

The thickness of the coating layer 5 can be adjusted, for example, by repeating the steps for application, washing and hydrolysis treatment of the film-forming material. In other words, by repeating the series of operations including applying the film-forming material to form a coating film, conducting washing, allowing a standing period if required, and then conducting a hydrolysis treatment, a uniform thin film of the desired thickness can be formed.

By employing this type of operation, a coating film 5 with a thickness from several nm to several tens of nm, specifically from 1 nm to 50 nm, and depending on conditions a thickness of up to several hundred nm, specifically 200 nm, can be formed with superior precision.

For example, in those cases where a film-forming material is used that includes a metal alkoxide with a single metal atom, such as silicon tetraisocyanate or titanium butoxide, as the metal compound (W), appropriate adjustment of the contact conditions enables thin films with a thickness of several angstroms to be sequentially laminated on top of one another.

In this case, increases in the film thickness per cycle correspond with the number of repetitions of layer formation using the film-forming material.

On the other hand, when fine particles of an alkoxide gel or the like are used as the metal compound (W), a thin film with a thickness of approximately 60 nm can be laminated within each cycle. Furthermore, in those cases where a spin coating method is used to form the coating film of the film-forming material, appropriate adjustment of factors such as the solvent, the concentration of the metal compound (W) and the spin speed enable the film thickness to be controlled within a range from several nm, specifically 2 nm, up to approximately 200 nm.

In this case, by altering the metal compound (W) used within each cycle, a laminate can be obtained in which thin films of different metal compounds (W) are laminated on top of one another.

In terms of achieving a favorable balance between the aspect ratio of the target pattern and the throughput, which takes the time required for etching of the organic film 2A into consideration, the total thickness (height) of the organic film pattern 2B, the resist pattern 3B and the coating layer 5 is preferably not more than 1 μm, even more preferably not more than 0.7 μm, and is most preferably 0.5 μm or less. There are no particular restrictions on the lower limit for this total thickness, although the total is preferably at least 0.01 µm, and is even more preferably 0.05 µm or greater.

[Etching Step]

Subsequently, as shown in FIG. 1C, the underlying organic film 2A is etched, preferably by dry etching, using the resist pattern 3B coated with the coating layer 5 as a mask. As a result, an organic film pattern 2B is formed from the organic film 2A, enabling the formation of a pattern with a high aspect ratio in which the resist pattern 3B is laminated on top of the organic film pattern 2B (see FIG. 1D).

In terms of ensuring satisfactory protection of the resist pattern 3B by the coating layer 5 relative to the etching, and achieving favorable production efficiency, oxygen plasma etching or etching using $CF_4$ gas or $CHF_3$ gas is preferred, and oxygen plasma etching is particularly desirable.

Of the various possibilities, as described below, the organic film 2A is preferably formed from a material such as a novolak resin which is readily etched using oxygen plasma etching, but exhibits comparatively high resistance to halogen gases, and specifically fluorocarbon gases such as $CF_4$ gas or $CHF_3$ gas. The etching of the substrate 1 is generally conducted using a halogen gas such as a fluorocarbon gas, and consequently by forming the organic film 2A from this type of material, not only can the processing properties be improved by using oxygen plasma etching during formation of the organic film pattern 2B, but the level of etching resistance can be improved within post processes that use a halogen gas such as a fluorocarbon gas to conduct etching of the substrate 1 or the like.

Moreover, by subsequently processing the underlying substrate 1 by etching, using the pattern obtained in the above manner as a mask, a semiconductor device or the like can be produced.

This etching is preferably an etching treatment that uses a halogen gas, etching that uses a fluorocarbon gas is even more preferred, and etching that uses $CF_4$ gas or $CHF_3$ gas is particularly desirable.

The coating layer 5 has the function of protecting the resist pattern 3B during etching of the organic film 2A, whereas during etching of the substrate 1, the coating layer 5 has the function of protecting the pattern formed from the organic film pattern 2B and the resist pattern 3B, and is therefore capable of improving the etching resistance of this laminated pattern.

Here, an example was described in which, as shown in FIG. 1C, the coating layer was provided on the upper surface and the side walls of the resist pattern 3B, but a configuration can also be adopted in which the coating layer 5 is provided only on the upper surface, and is not formed on the side walls. In order to maximize the function of the mask used for etching the organic film 2A, the coating layer 5 is preferably provided on both the upper surface and the side walls.

Furthermore, in this example, a method was described in which a laminated pattern was formed containing the organic film 2A and the resist film 3A, but a coating layer formed from the film-forming material may also be formed on a pattern formed directly on top of the substrate 1, and the pattern including this coating layer may then be used as a mask to conduct etching of the underlying substrate. In this case, because the pattern is protected by the coating layer in a similar manner to that described above, the etching resistance is high, and the pattern is able to withstand severe etching conditions.

[Resist Composition (Pattern-forming Material)]

A resist composition that can be used favorably for forming a pattern such as the resist pattern 3B shown in FIG. 1B includes an organic compound that contains a hydrophilic group and has a molecular weight of at least 500. By using such a composition, a coating layer of the film-forming material can be formed favorably on top of the pattern formed from the composition, and as a result, a pattern of favorable shape can be obtained.

In other words, if hydrophilic groups exist at the pattern surface, then those hydrophilic groups can be used as functional groups (reactive groups) capable of interacting with the material of the coating layer formed on top of the pattern. As a result, a coating layer that exhibits superior adhesion to the pattern can be formed. Furthermore, a high-density coating layer can be formed on top of the pattern, enabling the formation of a pattern with a shape that exhibits favorable mechanical strength.

Furthermore, by ensuring that the molecular weight of the organic compound is at least 500, a nano level pattern can be formed more readily.

Organic compounds with a molecular weight of at least 500 for addition to the resist composition can be broadly classified into low molecular weight compounds with a molecular weight of at least 500 but not more than 2,000, and high molecular weight compounds with a molecular weight of 2,000 or greater. In the case of high molecular weight compounds, the "molecular weight" refers to the polystyrene-equivalent weight average molecular weight measured using GPC (gel permeation chromatography).

The hydrophilic group within the organic compound incorporated within the resist composition preferably includes one or more groups selected from the group consisting of a hydroxyl group, carboxyl group, carbonyl group (—C(O)—), ester group (an ester linkage; —C(O)—O—), amino group and amide group. Of these groups, a hydroxyl group, particularly an alcoholic hydroxyl group or phenolic hydroxyl group, a carboxyl group, and an ester group are particularly preferred.

Of these, a carboxyl group, alcoholic hydroxyl group or phenolic hydroxyl group form a coating layer more readily on the pattern surface, and are consequently preferred. Furthermore, they also enable the formation of a pattern with minimal line edge roughness (unevenness within the pattern side walls) at the nano level.

The quantity of the hydrophilic group within the organic compound incorporated within the resist composition affects the quantity of hydrophilic groups per unit of surface area at the pattern surface. Accordingly, this quantity of the hydrophilic group affects the adhesion and density of the coating layer formed on the pattern.

In those cases where the organic compound is an aforementioned high molecular weight compound, the organic compound preferably contains at least 0.2 equivalents of the hydrophilic group, and this quantity is even more preferably within a range from 0.5 to 0.8 equivalents, and is most preferably from 0.6 to 0.75 equivalents. This means that if the high molecular weight compound is assumed to be formed from a structural unit containing a hydrophilic group and another structural unit, then the quantity of the former structural unit is at least 20 mol %, preferably within a range from 50 to 80 mol %, and is most preferably from 60 to 75 mol %.

In the present invention, the terms "structural unit" and "unit" refer to a monomer unit that contributes to the formation of a polymer.

Resist compositions include positive and negative compositions. In the present invention, the resist composition is preferably a positive composition.

Furthermore, the resist composition is preferably a chemically amplified composition that includes an acid generator component (B) (hereafter referred to as the component (B)) that generates acid upon exposure. The term "exposure" also includes irradiation with other forms of radiation such as an electron beam.

In other words, in the resist composition, the aforementioned organic compound can be an alkali-soluble resin or a resin that can be converted to an alkali-soluble form (hereafter referred to as the component (A)). The former has so-called negative radiation sensitivity, whereas the latter has so-called positive radiation sensitivity.

In the case of a negative composition, a cross-linker is blended into the resist composition together with the component (B). Then, during pattern formation by lithography, when acid is generated from the component (B) upon exposure, the action of this acid causes cross-linking between the component (A) and the cross-linker, causing the composition to become alkali-insoluble. As the cross-linker, melamine that contains a methylol group or alkoxymethyl group, or an amino-based cross-linker such as urea or glycoluril or the like is usually used.

In the case of a positive composition, the component (A) is an alkali-insoluble resin containing so-called acid-dissociable, dissolution-inhibiting groups. When acid is generated from the component (B) upon exposure, this acid causes the acid-dissociable, dissolution-inhibiting groups to dissociate, rendering the resin component (A) alkali-soluble.

In a preferred configuration, the organic compound is a compound that contains an acid-dissociable, dissolution-inhibiting group in addition to the hydrophilic group. Alternatively, the hydrophilic group may also function as an acid-dissociable, dissolution-inhibiting group.

In those cases where the organic compound is an aforementioned high molecular weight compound, the compound is preferably a resin with a weight average molecular weight that is larger than 2,000 but not more than 30,000 that includes a unit containing a hydrophilic group and a unit containing an acid-dissociable, dissolution-inhibiting group. The proportion of the former unit is typically at least 20 mol %, and is preferably 50 mol % or greater.

The weight average molecular weight is even more preferably at least 3,000 but not more than 30,000, and is most preferably at least 5,000 but not more than 20,000.

The proportion of the aforementioned unit containing a hydrophilic group is even more preferably 60 mol % or greater, and is most preferably 75 mol % or greater. Although there are no particular restrictions on the upper limit for this proportion, values of not more than 80 mol % are preferred.

The unit containing the hydrophilic group is preferably a unit that contains a carboxyl group, alcoholic hydroxyl group or phenolic hydroxyl group, and is most preferably a unit derived from acrylic acid, methacrylic acid, an (α-lower alkyl)acrylate ester containing an alcoholic hydroxyl group, or hydroxystyrene.

On the other hand, in those cases where the organic compound is an aforementioned low molecular weight compound, each molecule of the low molecular weight compound preferably contains from 1 to 20 equivalents, and even more preferably 2 to 10 equivalents, of the hydrophilic group.

Here, the expression "each molecule contains from 1 to 20 equivalents of the hydrophilic group" means that from 1 to 20 of the hydrophilic groups exist within each molecule.

As follows is a description of preferred embodiments of the resist composition.

(1) An example of a radiation-sensitive resist composition that includes a high molecular weight compound as the organic compound is a resist composition containing:

(A-1) a high molecular weight compound that contains a hydrophilic group and an acid-dissociable, dissolution-inhibiting group, and (B) an acid generator.

(2) An example of a radiation-sensitive resist composition that includes a low molecular weight compound as the organic compound is a resist composition containing:

(A-2) a low molecular weight compound that contains a hydrophilic group and an acid-dissociable, dissolution-inhibiting group, and (B) an acid generator.

In the above resist compositions of (1) or (2), the components (A-1) and (A-2) may also be used in combination.

As the component (A-1) and the component (A-2), provided the component is an organic compound that contains a hydrophilic group and has a molecular weight of at least 500, either one, or a mixture of two or more, of the organic compounds typically used for conventional chemically amplified resists can be used. A more detailed description is provided below.

<Component (A-1)>

Novolak resins, hydroxystyrene-based resins, (α-lower alkyl)acrylate ester resins, and copolymer resins containing structural units derived from hydroxystyrene and structural units derived from an (α-lower alkyl)acrylate ester, which contain a hydrophilic group and an acid-dissociable, dissolution-inhibiting group, can be used favorably as the component (A-1).

In the present invention, the expression "(α-lower alkyl) acrylic acid" refers to either one of, or both, the α-lower alkyl acrylic acid and acrylic acid. The term "(α-lower alkyl)acrylate" refers to either one of, or both, the α-lower alkyl acrylate and the acrylate. An α-lower alkyl acrylic acid is a compound in which a lower alkyl group is bonded to the carbon atom to which the acrylic acid carbonyl group is bonded.

The term "(α-lower alkyl)acrylate ester" represents an ester derivative of "(α-lower alkyl)acrylic acid".

A "structural unit derived from an (α-lower alkyl)acrylate ester" is a structural unit that is formed by cleavage of the ethylenic double bond of an (α-lower alkyl)acrylate ester, and hereafter may also be referred to as an "(α-lower alkyl)acrylate structural unit".

A "structural unit derived from hydroxystyrene" is a structural unit that is formed by cleavage of the ethylenic double bond of hydroxystyrene or an α-lower alkyl hydroxystyrene, and hereafter may also be referred to as a "hydroxystyrene unit". An "α-lower alkyl hydroxystyrene" refers to a compound in which a lower alkyl group is bonded to the carbon atoms to which the phenyl group is bonded.

In a "structural unit derived from an α-lower alkyl acrylate ester" and a "structural unit derived from an α-lower alkyl hydroxystyrene", the lower alkyl group bonded to the α-position is an alkyl group of 1 to 5 carbon atoms, and is preferably a straight-chain or branched-chain alkyl group. Examples include a methyl group, ethyl group, propyl group, isopropyl group, n-butyl group, isobutyl group, tert-butyl group, pentyl group, isopentyl group, and neopentyl group.

A methyl group is preferred industrially.

Although there are no particular restrictions on preferred resin components for use as the component (A-1), suitable examples include positive resist resin components that include a unit containing a phenolic hydroxyl group, such as a structural unit (a1) described below, a structural unit containing an acid-dissociable, dissolution-inhibiting group, such as one or more units selected from the group consisting of a structural unit (a2) described below and a structural unit (a3) described below, and where necessary an alkali-insoluble unit such as a structural unit (a4).

The resin component displays increased alkali solubility under the action of acid. In other words, the action of the acid generated from the acid generator upon exposure causes cleavage within the structural unit (a2) and/or the structural unit (a3), and this causes the resin, which was initially insoluble in an alkali developing solution, to undergo an increase in alkali solubility. As a result, exposure and developing can be used to form a chemically amplified positive pattern.

Structural Unit (a1)

The structural unit (a1) is a unit that contains a phenolic hydroxyl group, and is preferably a unit derived from hydroxystyrene, represented by a general formula (I) shown below.

[Formula 3]

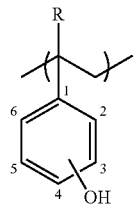

(I)

(wherein, R represents a hydrogen atom or a lower alkyl group)

R represents either a hydrogen atom or a lower alkyl group. The lower alkyl group is as defined above, and a hydrogen atom or a methyl group are particularly desirable. This definition of R also applies below.

There are no particular restrictions on the bonding position of the —OH group to the benzene ring, although the position labeled 4 in the formula (the para position) is preferred.

From the viewpoint of forming a favorable pattern, the quantity of the structural unit (a1) within the resin is typically within a range from 40 to 80 mol %, and is preferably from 50 to 75 mol %. By ensuring that this quantity is at least 40 mol %, the solubility of the resin in the alkali developing solution can be improved, and a favorable improvement in the pattern shape can also be obtained. Ensuring the quantity is not more than 80 mol % enables a favorable balance to be achieved with the other structural units.

Furthermore, in terms of forming a coating layer on top of the pattern, the quantity of the structural unit (a1) within the resin is preferably at least 50 mol %, even more preferably at least 60 mol %, and is most preferably 75 mol % or greater. Although there are no particular restrictions on the upper limit, quantities of not more than 80 mol % are preferred. If the quantity falls within the above range, then the presence of the phenolic hydroxyl groups enables a favorable coating layer to be formed on the pattern, and a favorable pattern shape can also be obtained. Furthermore, the adhesion between the pattern and the coating layer is also favorable.

Structural Unit (a2)

The structural unit (a2) is a structural unit containing an acid-dissociable, dissolution-inhibiting group, and is represented by a general formula (II) shown below.

[Formula 4]

(II)

(wherein, R is as defined above, and X represents an acid-dissociable, dissolution-inhibiting group)

Examples of the acid-dissociable, dissolution-inhibiting group X include alkyl groups with a tertiary carbon atom in which the tertiary carbon atom of that tertiary alkyl group is bonded to the ester group [—C(O)O—], as well as cyclic acetal groups such as a tetrahydropyranyl group and tetrahydrofuranyl group. The number of carbon atoms within the group X is preferably within a range from 3 to 17.

In addition to the groups described above, this type of acid-dissociable, dissolution-inhibiting group X may also be any of the groups typically used within chemically amplified positive resist compositions.

As the structural unit (a2), units such as those represented by the general formula (III) shown below are preferred.

[Formula 5]

(III)

In this formula, R is as defined above, $R^{11}$, $R^{12}$ and $R^{13}$ each represent, independently, a lower alkyl group (which may be a straight-chain or branched chain, and preferably contains from 1 to 5 carbon atoms). Furthermore, of the groups $R^{11}$, $R^{12}$ and $R^{13}$, $R^{11}$ may represent a lower alkyl group, and $R^{12}$ and $R^{13}$ may be bonded together to form a monocyclic or polycyclic alicyclic group (in which the number of carbon atoms within the alicyclic group is preferably from 5 to 12).

In those cases where the structural unit does not include an alicyclic group, units in which $R^{11}$, $R^{12}$ and $R^{13}$ all represent methyl groups are preferred.

In those cases where the structural unit includes an alicyclic group, then in the case of a monocyclic alicyclic group, units containing a cyclopentyl group or cyclohexyl group or the like are preferred.

Furthermore, of the various structural units containing a polycyclic alicyclic group, examples of preferred units include those represented by a general formula (IV) shown below.

[Formula 6]

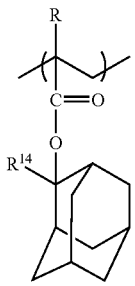

(IV)

[wherein, R is as defined above, and $R^{14}$ represents a lower alkyl group (which may be a straight-chain or branched-chain, and preferably contains from 1 to 5 carbon atoms)]

Furthermore, as a structural unit containing an acid-dissociable, dissolution-inhibiting group that includes a polycyclic alicyclic group, units represented by a general formula (V) shown below are preferred.

[Formula 7]

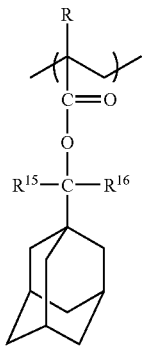

(V)

[wherein, R is as defined above, and $R^{15}$ and $R^{16}$ each represent, independently, a lower alkyl group (which may be a straight-chain or branched-chain, and preferably contains from 1 to 5 carbon atoms)]

The quantity of the structural unit (a2) within the resin is typically within a range from 5 to 50 mol %, and is preferably from 10 to 40 mol %, and even more preferably from 10 to 35 mol %.

Structural Unit (a3)

The structural unit (a3) is a structural unit containing an acid-dissociable, dissolution-inhibiting group, and is represented by a general formula (VI) shown below.

[Formula 8]

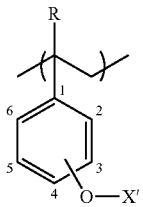

(VI)

(wherein, R is as defined above, and X' represents an acid-dissociable, dissolution-inhibiting group)

Examples of the acid-dissociable, dissolution-inhibiting group X' include tertiary alkyloxycarbonyl groups such as a tert-butyloxycarbonyl group or tert-amyloxycarbonyl group; tertiary alkyloxycarbonylalkyl groups such as a tert-butyloxycarbonylmethyl group or tert-butyloxycarbonylethyl group; tertiary alkyl groups such as a tert-butyl group or tert-amyl group; cyclic acetal groups such as a tetrahydropyranyl group or tetrahydrofuranyl group; and alkoxyalkyl groups such as an ethoxyethyl group or methoxypropyl group. The number of carbon atoms within the group X' is preferably within a range from 4 to 10.

Of these groups, a tert-butyloxycarbonyl group, tert-butyloxycarbonylmethyl group, tert-butyl group, tetrahydropyranyl group or ethoxyethyl group is preferred.

In addition to the groups listed above, the acid-dissociable, dissolution-inhibiting group X' can also use other groups typically used in chemically amplified positive resist compositions.

In the general formula (VI), there are no particular restrictions on the position at which the (—OX') group is bonded to the benzene ring, although bonding at the position labeled 4 in the above formula (the para position) is preferred.

The quantity of the structural unit (a3) within the resin is typically within a range from 5 to 50 mol %, and is preferably from 10 to 40 mol %, and even more preferably from 10 to 35 mol %.

Structural Unit (a4)

The structural unit (a4) is an alkali-insoluble unit, and is represented by a general formula (VII) shown below.

[Formula 9]

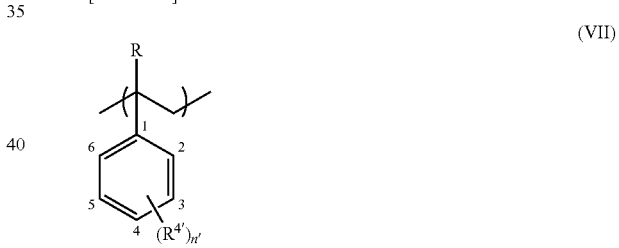

(VII)

(wherein, R is as defined above, $R^{4'}$ represents a lower alkyl group, and n' represents either 0 or an integer from 1 to 3)

The lower alkyl group of $R^{4'}$ may be either a straight-chain or a branched-chain, and preferably contains from 1 to 5 carbon atoms.

n' is either 0 or an integer from 1 to 3, and is preferably 0.

The quantity of the structural unit (a4) within the resin component is typically within a range from 1 to 40 mol %, and is preferably from 5 to 25 mol %. By ensuring this quantity is at least 1 mol %, the level of improvement in the shape (and particularly the improvement in thickness loss) is enhanced, whereas ensuring the quantity is not more than 40 mol % enables a favorable balance to be achieved with the other structural units.

The component (A-1) must contain the structural unit (a1) and at least one structural unit selected from the group consisting of the structural unit (a2) and the structural unit (a3), and may also contain a structural unit (a4). Furthermore, the component (A-1) may be a copolymer containing all of the structural units, or a mixture of a plurality of different polymers each containing at least one of the structural units. Combinations of these two possibilities are also possible.

Furthermore, the component (A-1) may also include other units other than the structural units (a1), (a2), (a3) and (a4) described above, although the structural units (a1), (a2), (a3) and (a4) preferably represent at least 80 mol %, and even more preferably at least 90 mol %, and most preferably 100 mol % of the component (A-1).

The use of "a single copolymer (1) containing the structural unit (a1) and the structural unit (a3), or a mixture of two or more different copolymers of this type", or "a copolymer (2) containing the structural unit (a1), the structural unit (a2) and the structural unit (a4), or a mixture of two or more different copolymers of this type", or a mixture of these two configurations offers a simple way of achieving the desired effects, and is therefore the most preferred configuration. Furthermore, this configuration also offers a favorable improvement in the heat resistance.

The monomer that gives rise to the structural unit (a3) is preferably a mixture of a hydroxystyrene protected with a tertiary alkyloxycarbonyl group and a hydroxystyrene protected with a 1-alkoxyalkyl group.

The weight ratio during mixing (hydroxystyrene protected with a tertiary alkyloxycarbonyl group/hydroxystyrene protected with a 1-alkoxyalkyl group) is typically within a range from 1/9 to 9/1, is preferably from 2/8 to 8/2, and is most preferably from 2/8 to 5/5.

The polystyrene equivalent weight average molecular weight of the component (A-1), as determined by GPC, is typically greater than 2,000, and is preferably larger than 2,000 but not more than 30,000, even more preferably at least 3,000 but not more than 30,000, and is most preferably at least 5,000 but not more than 20,000.

The component (A-1) can be produced by polymerization of the material monomers for the aforementioned structural units using known methods.

In terms of enabling formation of a pattern with a lower etching resistance, an example of a resin component (A-1') that is suitable as the component (A-1) but is different from that described above is a resin component that contains an α-lower alkyl)acrylate ester resin, and resin components formed solely from an α-lower alkyl)acrylate ester resin are particularly desirable.

Of these (α-lower alkyl)acrylate ester resins, a resin containing a structural unit (a5) derived from an α-lower alkyl) acrylate ester containing an acid-dissociable, dissolution-inhibiting group is preferred. The α-lower alkyl group is as defined above.

The acid-dissociable, dissolution-inhibiting group of the structural unit (a5) has an alkali dissolution-inhibiting effect that renders the entire component (A-1') alkali-insoluble prior to exposure, but then dissociates following exposure as a result of the action of the acid generated from the component (B), causing the entire component (A-1') to change to an alkali-soluble state.

The acid-dissociable, dissolution-inhibiting group can be, for example, any of the multitude of groups that have been proposed for the resins used within resist compositions designed for use with ArF excimer lasers. Generally, groups that form a cyclic or chain-like tertiary alkyl ester with the carboxyl group of the (α-lower alkyl)acrylic acid, or a cyclic or chain-like alkoxyalkyl group are the most widely known.

Here, a "group that forms a tertiary alkyl ester" describes a group that forms an ester by substituting the hydrogen atom of the acrylic acid carboxyl group. In other words, a structure in which the tertiary carbon atom of a chain-like or cyclic tertiary alkyl group is bonded to the oxygen atom at the terminal of the carbonyloxy group [—C(O)—O—] of the acrylate ester. In this tertiary alkyl ester, the action of acid causes cleavage of the bond between the oxygen atom and the tertiary carbon atom.

A tertiary alkyl group refers to an alkyl group that includes a tertiary carbon atom.

Examples of groups that form a chain-like tertiary alkyl ester include a tert-butyl group and a tert-amyl group.

Examples of groups that form a cyclic tertiary alkyl group include the same groups as those exemplified below in relation to the "acid-dissociable, dissolution-inhibiting group that contains an alicyclic group".

A "cyclic or chain-like alkoxyalkyl group" forms an ester by substitution with the hydrogen atom of a carboxyl group. In other words, a structure is formed in which the alkoxyalkyl group is bonded to the oxygen atom at the terminal of the carbonyloxy group [—C(O)—O—] of the acrylate ester. In this structure, the action of acid causes cleavage of the bond between the oxygen atom and the alkoxyalkyl group.

Examples of this type of cyclic or chain-like alkoxyalkyl group include a 1-methoxymethyl group, 1-ethoxyethyl group, 1-isopropoxyethyl group, 1-cyclohexyloxyethyl group, 2-adamantoxymethyl group, 1-methyladamantoxymethyl group, 4-oxo-2-adamantoxymethyl group, 1-adamantoxyethyl group, and 2-adamantoxyethyl group.

As the structural unit (a5), structural units that include an acid-dissociable, dissolution-inhibiting group that contains a cyclic group, and particularly an aliphatic cyclic group, are preferred.

Here, the term "aliphatic" is as defined above, and the term "aliphatic cyclic group" describes a monocyclic group or polycyclic group that contains no aromaticity.

The aliphatic cyclic group may be either monocyclic or polycyclic, and can be selected appropriately from the multitude of groups proposed for use within ArF resists and the like. From the viewpoint of ensuring favorable etching resistance, a polycyclic alicyclic group is preferred. Furthermore, the alicyclic group is preferably a hydrocarbon group, and is even more preferably a saturated hydrocarbon group (an alicyclic group).

Examples of suitable monocyclic alicyclic groups include groups in which one hydrogen atom has been removed from a cycloalkane. Examples of suitable polycyclic alicyclic groups include groups in which one hydrogen atom has been removed from a bicycloalkane, tricycloalkane or tetracycloalkane or the like.

Specifically, examples of suitable monocyclic alicyclic groups include a cyclopentyl group or cyclohexyl group. Examples of suitable polycyclic alicyclic groups include groups in which one hydrogen atom has been removed from a polycycloalkane such as adamantane, norbornane, isobornane, tricyclodecane or tetracyclododecane.

Of these groups, an adamantyl group in which one hydrogen atom has been removed from adamantane, a norbornyl group in which one hydrogen atom has been removed from norbornane, a tricyclodecanyl group in which one hydrogen atom has been removed from tricyclodecane, and a tetracyclododecanyl group in which one hydrogen atom has been removed from tetracyclododecane are preferred industrially.

More specifically, the structural unit (a5) is preferably at least one unit selected from the general formulas (I') to (III') shown below.

Furthermore, the structural unit (a5) is preferably a unit derived from an α-lower alkyl)acrylate ester which contains an aforementioned cyclic alkoxyalkyl group at the ester portion, and more specifically, is preferably at least one structural unit selected from amongst units derived from an aliphatic polycyclic alkyloxy lower alkyl(α-lower alkyl)acrylate ester that may contain a substituent group such as a 2-adamantyl-methyl group, 1-methyladamnatoxymethyl group, 4-oxo-2-adamantoxymethyl group, 1-adamantoxyethyl group or 2-adamantoxyethyl group.

[Formula 10]

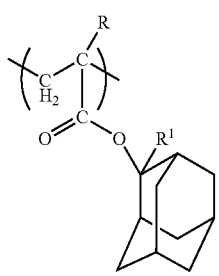

(I')

[In the formula (I'), R is as defined above, and $R^1$ represents a lower alkyl group.]

[Formula 11]

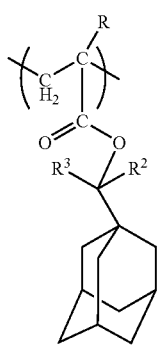

(II')

[In the formula (II'), R is as defined above, and $R^1$ and $R^3$ each represent, independently, a lower alkyl group.]

[Formula 12]

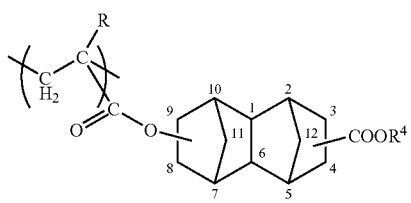

(III')

[In the formula (III'), R is as defined above, and $R^4$ represents a tertiary alkyl group.]

In the formulas (I') to (III'), the hydrogen atom or lower alkyl group represented by R is the same as that described above in relation to the hydrogen atom or lower alkyl group bonded to the α-position of an acrylate ester.

The lower alkyl group of $R^1$ is preferably a straight-chain or branched alkyl group of 1 to 5 carbon atoms, and specific examples include a methyl group, ethyl group, propyl group, isopropyl group, n-butyl group, isobutyl group, pentyl group, isopentyl group, and neopentyl group. Of these, a methyl group or ethyl group is preferred from the viewpoint of industrial availability.

The lower alkyl groups of $R^1$ and $R^3$ each preferably represent, independently, a straight-chain or branched alkyl group of 1 to 5 carbon atoms. Of the various possibilities, those cases in which $R^2$ and $R^3$ are both methyl groups are preferred industrially. A structural unit derived from 2-(1-adamantyl)-2-propyl acrylate is a specific example.

Furthermore, the group $R^4$ is a chain-like tertiary alkyl group or a cyclic tertiary alkyl group. Examples of chain-like tertiary alkyl groups include a tert-butyl group or tert-amyl group, although a tert-butyl group is preferred industrially.

Examples of cyclic tertiary alkyl groups include the same groups as those exemplified above in relation to the "acid-dissociable, dissolution-inhibiting group that contains an aliphatic cyclic group", and specific examples include a 2-methyl-2-adamantyl group, 2-ethyl-2-adamantyl group, 2-(1-adamantyl)-2-propyl group, 1-ethylcyclohexyl group, 1-ethylcyclopentyl group, 1-methylcyclohexyl group and 1-methylcyclopentyl group.

Furthermore, the group —$COOR^4$ may be bonded to either position 3 or 4 of the tetracyclododecanyl group shown in the formula, although the bonding position cannot be further specified. Furthermore, in a similar manner, the carboxyl group residue of the acrylate structural unit may be bonded to either position 8 or 9 within the formula.

The structural unit (a5) may be either a single structural unit, or a combination of two or more different structural units.

The proportion of the structural unit (a5) within the (α-lower alkyl)acrylate ester resin component, relative to the combined total of all the structural units that constitute the component (A-1'), is preferably within a range from 20 to 60 mol %, even more preferably from 30 to 50 mol %, and is most preferably from 35 to 45 mol %. By ensuring that this proportion is at least as large as the lower limit of the above range, a favorable pattern can be obtained, whereas ensuring that the proportion is no greater than the upper limit enables a favorable balance to be achieved with the other structural units.

The α-lower alkyl)acrylate ester resin preferably also includes, in addition to the structural unit (a5) described above, a structural unit (a6) derived from an α-lower alkyl) acrylate ester that contains a lactone ring. The structural unit (a6) is effective in improving the adhesion of the resist film to the substrate, and enhancing the hydrophilicity of the resin relative to the developing solution. Furthermore, the structural unit (a6) also enables the formation of a coating layer that exhibits superior adhesion to the pattern.

In the structural unit (a6), a lower alkyl group or a hydrogen atom is bonded to the α-position carbon atom. The lower alkyl group bonded to the α-position carbon atom is the same as that described above for the structural unit (a5), and is preferably a methyl group.

Examples of the structural unit (a6) include structural units in which a monocyclic group formed from a lactone ring or a polycyclic cyclic group that includes a lactone ring is bonded to the ester side-chain portion of an α-lower alkyl)acrylate ester. The term lactone ring refers to a single ring containing a —O—C(O)— structure, and this ring is counted as the first ring. Accordingly, in this description, the case in which the only ring structure is the lactone ring is referred to as a monocyclic group, and groups containing other ring structures are described as polycyclic groups regardless of the structure of the other rings.

Examples of the structural unit (a6) include units that contain a monocyclic group in which one hydrogen atom has been removed from γ-butyrolactone, and units that contain a polycyclic group in which one hydrogen atom has been removed from a lactone ring-containing bicycloalkane.

Specifically, the structural unit (a6) is preferably at least one unit selected from general formulas (IV') through (VII') shown below.

[Formula 13]

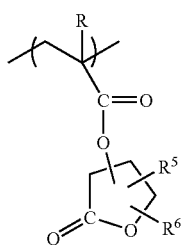

(IV')

[In the formula (IV'), R is as defined above, and $R^5$ and $R^6$ each represent, independently, a hydrogen atom or a lower alkyl group.]

[Formula 14]

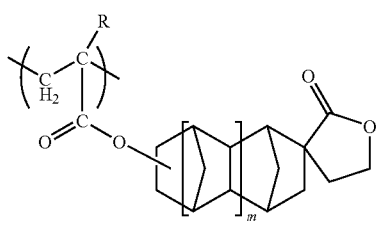

(V')

[In the formula (V'), R is as defined above, and m represents either 0 or 1.]

[Formula 15]

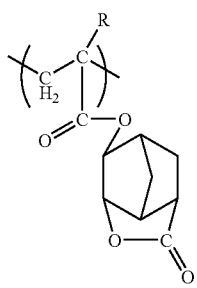

(VI')

[In the formula (VI'), R is as defined above.]

[Formula 16]

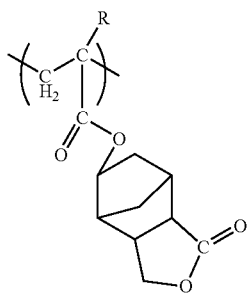

(VII')

[In the formula (VII'), R is as defined above.]

In the formula (IV'), $R^5$ and $R^6$ each represent, independently, a hydrogen atom or a lower alkyl group, and preferably represent a hydrogen atom. The lower alkyl groups for the groups $R^5$ and $R^6$ are preferably straight-chain or branched alkyl groups of 1 to 5 carbon atoms, and specific examples include a methyl group, ethyl group, propyl group, isopropyl group, n-butyl group, isobutyl group, tert-butyl group, pentyl group, isopentyl group, and neopentyl group. A methyl group is preferred industrially.

Furthermore, amongst the structural units represented by the general formulas (IV') through (VII'), structural units represented by the general formula (IV') are low cost and therefore preferred industrially, and of the possible structural units represented by the formula (IV'), methacryloyloxy-γ-butyrolactone, in which R is a methyl group, $R^5$ and $R^6$ are both hydrogen atoms, and the position of the ester linkage between the methacrylate ester and the γ-butyrolactone is at the α-position of the lactone ring, is the most desirable.

As the structural unit (a6) may use either a single structural unit, or a combination of two or more different structural units may be used.

The proportion of the structural unit (a6) within the (α-lower alkyl)acrylate ester resin component, relative to the combined total of all the structural units that constitute the component (A-1'), is preferably within a range from 20 to 60 mol %, even more preferably from 20 to 50 mol %, and is most preferably from 30 to 45 mol %. Ensuring that this proportion is at least as large as the lower limit of the above range improves the lithography properties, whereas ensuring that the proportion is no greater than the upper limit enables a favorable balance to be achieved with the other structural units.

In the component (A-1'), the α-lower alkyl)acrylate ester resin component preferably also includes, either in addition to the structural unit (a5) described above or in addition to the structural units (a5) and (a6), a structural unit (a7) derived from an (α-lower alkyl)acrylate ester that contains a polar group-containing polycyclic group. Including the structural unit (a7) increases the hydrophilicity of the entire α-lower alkyl)acrylate ester resin component, thereby improving the affinity with the developing solution, improving the alkali solubility within the exposed portions of the resist, and contributing to an improvement in the resolution. Furthermore, the structural unit (a7) also enables the formation of a coating layer that exhibits superior adhesion to the pattern.

In the structural unit (a7), a lower alkyl group or a hydrogen atom is bonded to the α-position carbon atom. The lower alkyl group bonded to the α-position carbon atom is the same as that described above for the structural unit (a5), and is preferably a methyl group.

Examples of the polar group include a hydroxyl group, cyano group, carboxyl group, or amino group or the like, although a hydroxyl group is particularly preferred.

Examples of the polycyclic group include polycyclic groups selected from amongst the aliphatic cyclic groups exemplified above in relation to the "acid-dissociable, dissolution-inhibiting group that contains an aliphatic cyclic group" within the aforementioned structural unit (a5).

The structural unit (a7) is preferably at least one unit selected from the general formulas (VIII') through (IX') shown below.

[Formula 17]

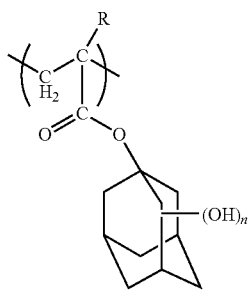

(VIII')

[In the formula (VIII'), R is as defined above, and n represents an integer from 1 to 3.]

In the formula (VIII'), R is as described above for the formulas (I') to (III').

Of these units, structural units in which n is 1, and the hydroxyl group is bonded to position 3 of the adamantyl group are preferred.

[Formula 18]

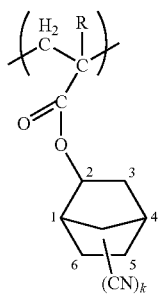

(IX')

[In the formula (IX'), R is as defined above, and k represents an integer from 1 to 3.]

Of these units, structural units in which k is 1 are preferred. Furthermore, the cyano group is preferably bonded to position 5 or position 6 of the norbornyl group.

The structural unit (a7) may be either a single structural unit, or a combination of two or more different structural units.

The proportion of the structural unit (a7) within the (α-lower alkyl)acrylate ester resin component, relative to the combined total of all the structural units that constitute the component (A-1'), is preferably within a range from 10 to 50 mol %, even more preferably from 15 to 40 mol %, and is most preferably from 20 to 35 mol %. Ensuring that this proportion is at least as large as the lower limit of the above range improves the lithography properties, whereas ensuring that the proportion is no greater than the upper limit enables a favorable balance to be achieved with the other structural units.

The (α-lower alkyl)acrylate ester resin component may include structural units other than the aforementioned structural units (a5) through (a7), but the combined total of these structural units (a5) through (a7), relative to the combined total of all the structural units, is preferably within a range from 70 to 100 mol %, and is even more preferably from 80 to 100 mol %.

The α-lower alkyl)acrylate ester resin component may include a structural unit (a8) besides the aforementioned structural units (a5) through (a7).

There are no particular restrictions on the structural unit (a8), which may be any other structural unit that cannot be classified as one of the above structural units (a5) through (a7).

For example, structural units that contain a polycyclic aliphatic hydrocarbon group and are derived from an α-lower alkyl)acrylate ester are preferred. Suitable examples of the polycyclic aliphatic hydrocarbon group include polycyclic groups selected from amongst the aliphatic cyclic groups exemplified above in relation to the "acid-dissociable, dissolution-inhibiting group that contains an aliphatic cyclic group". In terms of factors such as industrial availability, at least one group selected from amongst a tricyclodecanyl group, adamantyl group, tetracyclododecanyl group, norbornyl group and isobornyl group is particularly preferred. The polycyclic aliphatic hydrocarbon group within the structural unit (a8) is most preferably a non-acid-dissociable group.

Specific examples of the structural unit (a8) include units of the structures (X) to (XII) shown below.

[Formula 19]

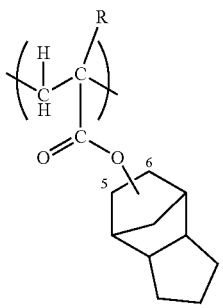

(X)

(wherein, R is as defined above)

[Formula 20]

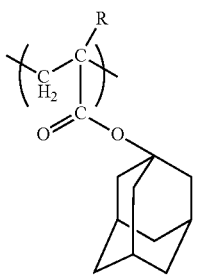

(XI)

(wherein, R is as defined above)

[Formula 21]

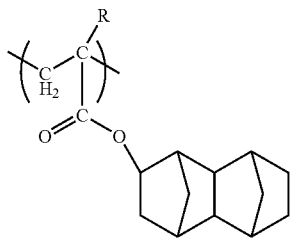

(XII)

(wherein, R is as defined above)

In those cases where a structural unit (a8) is included, the proportion of the structural unit (a8) within the α-lower alkyl) acrylate ester resin component, relative to the combined total of all the structural units that constitute the component (A-1'), is preferably within a range from 1 to 25 mol %, and is even more preferably from 5 to 20 mol %.

The α-lower alkyl)acrylate ester resin component is preferably a copolymer that includes at least the structural units (a5), (a6), and (a7). Examples of such copolymers include copolymers formed solely from the aforementioned structural units (a5), (a6) and (a7), and copolymers formed from the structural units (a5), (a6), (a7) and (a8).

The (α-lower alkyl)acrylate ester resin component can be obtained, for example, by a conventional radical polymerization or the like of the monomers corresponding with each of the structural units, using a radical polymerization initiator such as azobisisobutyronitrile (AIBN).

In the α-lower alkyl)acrylate ester resin component, the acid generated from the component (B) causes the acid-dissociable, dissolution-inhibiting group of the unit (a5) to dissociate, thereby generating a carboxyl group. The existence of these generated carboxyl groups enables the formation of a coating layer that exhibits superior adhesion to the pattern.

The weight average molecular weight (the polystyrene equivalent weight average molecular weight determined by gel permeation chromatography, this also applies below) of the α-lower alkyl)acrylate ester resin component is typically not more than 30,000, and is preferably not more than 20,000, even more preferably 12,000 or lower, and is most preferably 10,000 or lower.

There are no particular restrictions on the lower limit of the weight average molecular weight, although from the viewpoints of inhibiting pattern collapse and achieving a favorable improvement in resolution and the like, the weight average molecular weight is preferably at least 4,000, and even more preferably 5,000 or greater.

<Component (A-2)>

There are no particular restrictions on the compounds that can be used as the component (A-2), provided the compound has a molecular weight of at least 500 but not more than 2,000, contains a hydrophilic group, and also contains an acid-dissociable, dissolution-inhibiting group such as the groups X and X' described above in relation to the component (A-1).

Specific examples include compounds containing a plurality of phenol structures in which a portion of the hydroxyl group hydrogen atoms have been substituted with the aforementioned acid-dissociable, dissolution-inhibiting groups X or X'.

Examples of the component (A-2) include low molecular weight phenol compounds in which a portion of the hydroxyl group hydrogen atoms have been substituted with an aforementioned acid-dissociable, dissolution-inhibiting group, and these types of compounds are known, for example, as sensitizers or heat resistance improvers for use in non-chemically amplified g-line or i-line resists.

Examples of these low molecular weight phenol compounds include those compounds listed below.

Examples include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Of course this is not a restrictive list.

Similarly, there are no particular restrictions on the acid dissociable, dissolution inhibiting group, and suitable examples include the groups described above.

<Acid Generator (B)>

The component (B) can be appropriately selected from known materials used as acid generators in conventional chemically amplified resists. Examples of these acid generators include diazomethane-based acid generators, onium salts, and oxime sulfonate compounds.

Specific examples of suitable diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Specific examples of suitable onium salts include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate and triphenylsulfonium nonafluorobutanesulfonate. Of these, onium salts with a fluorinated alkylsulfonate ion as the anion are preferred.

Specific examples of suitable oxime sulfonate compounds include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

In the present invention, an onium salt and/or diazomethane-based acid generator is preferred, and of these, an onium salt with a fluorinated alkylsulfonate ion as the anion and/or a bis(alkylsulfonyl)diazomethane is preferred.

The component (B) may be either a single acid generator, or a combination of two or more different acid generators.

The quantity used of the component (B) is typically within a range from 1 to 20 parts by weight, and preferably from 2 to 10 parts by weight, per 100 parts by weight of the component (A-1) and/or the component (A-2). Ensuring that the quantity is at least as large as the lower limit of the above range enables favorable pattern formation, whereas ensuring that the proportion is no greater than the upper limit facilitates the production of a uniform solution, and enables favorable storage stability to be achieved.

<Optional Components>

In the resist composition, in order to improve the pattern shape and the post exposure stability of the latent image formed by the pattern-wise exposure of the resist layer, a nitrogen-containing organic compound (D) may be added as an optional component (D).

A multitude of these components (D) have already been proposed, and any of these known compounds can be used, although an amine, and in particular a secondary lower aliphatic amine or tertiary lower aliphatic amine, is preferred.

Here, a lower aliphatic amine refers to an alkyl or alkyl alcohol amine of not more than 5 carbon atoms, and examples of these secondary and tertiary amines include trimethylamine, diethylamine, triethylamine, di-n-propylamine, tri-n-propylamine, tripentylamine, diethanolamine, triethanolamine and triisopropanolamine, and tertiary alkanolamines such as triethanolamine and triisopropanolamine are particularly preferred.

These compounds may be used either alone, or in combinations of two or more different compounds.

The component (D) is typically added in a quantity within a range from 0.01 to 5.0 parts by weight per 100 parts by weight of the component (A-1) and/or the component (A-2).

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof may also be added as another optional component (E). The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A-1) and/or the component (A-2).

Other miscible additives can also be added to the resist composition according to need, including additive resins for improving the properties of the applied film of the resist composition, surfactants for improving the coating properties, dissolution inhibitors, plasticizers, stabilizers, colorants and halation prevention agents.

The resist composition can be produced by dissolving the materials in an organic solvent.

The organic solvent may be any solvent capable of dissolving the various components used to generate a uniform solution, and one or more solvents selected from known materials used as the solvents for conventional resist compositions can be used.

Specific examples of the solvent include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, propylene glycol monomethyl ether acetate (PGMEA), dipropylene glycol and dipropylene glycol monoacetate, and the monomethyl ethers, monoethyl ethers, monopropyl ethers, monobutyl ethers or monophenyl ethers of the aforementioned polyhydric alcohols and polyhydric alcohol esters; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate. Of these, PGMEA, EL, and propylene glycol monoethyl ether (PGME) are preferred.

These organic solvents may be used either alone, or as a mixed solvent of two or more different solvents.

There are no particular restrictions on the quantity of organic solvent, and a quantity that produces a suitable concentration for application to a solid substrate is used.

Besides the embodiments described above, the resist composition may also employ other known radiation-sensitive compositions that are known as resist compositions and also include an organic compound containing a hydrophilic group.

For example, a non-chemically amplified radiation-sensitive composition including a novolak resin, an alkali-soluble resin such as a hydroxystyrene resin, and a photosensitive component such as a compound containing a naphthoquinone diazide group can also be used as the resist composition. Furthermore, a sensitizer may also be added to the composition where necessary, and if a low molecular weight compound that contains a hydrophilic group and has a molecular weight of at least 500 is used as the sensitizer, then this compound can also function as the organic compound that represents one of the essential components of the resist composition, thereby contributing to the effects of the present invention.

[Organic Film Material]

The organic film is an organic film that is able to be etched using conventional etching methods, and particularly dry etching methods. This organic film is preferably insoluble in the alkali developing solution used for post-exposure developing.

The organic film material used for forming the organic film need not necessarily exhibit the type of sensitivity to an electron beam or light source shown by a resist film. The types of resists or resins typically used in the production of semiconductor elements and liquid crystal display elements can be used.

Furthermore, because the resist pattern 3B that has been coated with the coating layer 5 must be transferred to the organic film, the organic film material is preferably a material that is capable of forming an organic film that can be subjected to etching, and particularly dry etching. Of the various possibilities, materials that are capable of forming an organic film that can be etched by the type of oxygen plasma etching mentioned above are particularly preferred.

As this type of organic film material, the materials conventionally used for forming organic films such as organic BARC are suitable. Examples include the ARC series of products manufactured by Brewer Science Ltd., the AR series of products manufactured by Rohm and Haas Company, and the SWK series of products manufactured by Tokyo Ohka Kogyo Co., Ltd. Of these, in those cases where, as described above, oxygen plasma etching is used in the etching step, materials that are readily etched using oxygen plasma etching, but exhibit comparatively high resistance to halogen gases, and specifically fluorocarbon gases such as $CF_4$ gas or $CHF_3$ gas are preferred.

Furthermore, an organic film containing at least one resin component selected from the group consisting of novolak resins, acrylic resins and soluble polyimides may also be formed between the above organic BARC and the substrate.

These materials are preferred as they are readily etched by oxygen plasma etching or the like, and also display favorable resistance to fluorocarbon gases.

Of these materials, novolak resins, and acrylic resins containing an alicyclic region or aromatic ring on a side chain are cheap, widely used, and exhibit excellent resistance to fluorocarbon gas dry etching, and are consequently preferred.

As the novolak resin, any of the resins typically used in positive resist compositions can be used, and positive resists for i-line or g-line radiation containing a novolak resin as the primary component can also be used.

A novolak resin is a resin obtained, for example, by conducting an addition condensation of an aromatic compound containing a phenolic hydroxyl group (hereafter, simply referred to as a "phenol") and an aldehyde, in the presence of an acid catalyst.

Examples of the phenol used include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallate esters, α-naphthol, and β-naphthol.

Examples of the aldehyde include formaldehyde, furfural, benzaldehyde, nitrobenzaldehyde, and acetaldehyde.

There are no particular restrictions on the catalyst used in the addition condensation reaction, and suitable acid catalysts include hydrochloric acid, nitric acid, sulfuric acid, formic acid, oxalic acid, and acetic acid.

Commercially available products can be used as the novolak resin.

The lower limit for the weight average molecular weight (Mw) of the novolak resin is preferably 3,000, even more preferably 5,000, even more preferably 6,000, and is most preferably 7,000. The upper limit is preferably 50,000, even more preferably 30,000, even more preferably 10,000, and is most preferably 9,000.

Provided the value of Mw is at least 3,000, the resin is unlikely to sublime when baked at high temperatures, and therefore unlikely to contaminate the apparatus and the like. Furthermore, ensuring that the value of Mw is 5,000 or greater yields a superior level of etching resistance to fluorocarbon gases and the like.

Furthermore, provided the value of Mw is not more than 50,000, the resin exhibits favorable filling properties for substrates having very fine unevenness, whereas a value of Mw of 10,000 or less tends to facilitate dry etching.

Novolak resins with a Mw value of 5,000 to 50,000, and preferably from 8,000 to 30,000, in which the quantity of low molecular weight substances with a molecular weight of not more than 500, and preferably not more than 200, as measured by gel permeation chromatography, is not more than 1% by weight, and is preferably 0.8% by weight or less, are preferred. The quantity of the low molecular weight substances is preferably as small as possible, and is most preferably 0% by weight.

In a novolak resin having a Mw value within the above range, ensuring that the quantity of low molecular weight substances with a molecular weight of not more than 500 is 1% by weight or less yields favorable filling properties for substrates having very fine unevenness. The reason why such a reduction in the low molecular weight fraction should improve the filling characteristics remains unclear, although it is surmised that it is a reflection of the degree of dispersion.

Here, the expression "low molecular weight substances with a molecular weight of not more than 500" refers to substances that are detected as a low molecular weight fraction of molecular weight 500 or less during GPC analysis using polystyrene standards. These "low molecular weight substances with a molecular weight of not more than 500" include unpolymerized monomers, and low polymerization degree materials, which vary depending on the molecular weight, but include, for example, materials produced by the condensation of 2 to 5 phenol molecules with an aldehyde.

The quantity (weight %) of these low molecular weight substances with a molecular weight of not more than 500 is measured by graphing the results of the above GPC analysis with the fraction number across the horizontal axis and the concentration along the vertical axis, and then determining the ratio (%) of the area under the curve within the low molecular weight fraction for molecular weights of not more than 500, relative to the area under the entire curve.

As the acrylic resin, any of the resins typically used in positive resist compositions can be used, and suitable examples include acrylic resins containing structural units derived from a polymerizable compound containing an ether linkage, and structural units derived from a polymerizable compound containing a carboxyl group.

Examples of the polymerizable compound containing an ether linkage include (meth)acrylate derivatives containing both an ether linkage and an ester linkage such as 2-methoxyethyl(meth)acrylate, methoxytriethylene glycol (meth)acrylate, 3-methoxybutyl(meth)acrylate, ethylcarbitol (meth)acrylate, phenoxypolyethylene glycol (meth)acrylate, methoxypolypropylene glycol (meth)acrylate, and tetrahydrofurfuryl (meth)acrylate. These compounds may be used either alone, or in combinations of two or more different compounds. In the present invention, the term "(meth)acrylate" refers to either one of, or both, the acrylate and the methacrylate.

Examples of the polymerizable compound containing a carboxyl group include monocarboxylic acids such as acrylic acid, methacrylic acid, and crotonic acid; dicarboxylic acids such as maleic acid, fumaric acid, and itaconic acid; and compounds containing both a carboxyl group and an ester linkage such as 2-methacryloyloxyethylsuccinic acid, 2-methacryloyloxyethylmaleic acid, 2-methacryloyloxyethylphthalic acid, and 2-methacryloyloxyethylhexahydrophthalic acid, although of these, acrylic acid and methacrylic acid are preferred. These compounds may be used either alone, or in combinations of two or more different compounds.

The soluble polyimide refers to polyimides that can be converted to liquid form using an organic solvent.

These resin components may be used either alone, or in mixtures of two or more different resins.

The organic film can be formed, for example, by applying a solution prepared by dissolving the above resin component in an organic solvent to a substrate in accordance with normal methods.

The organic solvent can be the same solvents as those exemplified above as the organic solvent for the resist composition.

As described above, in a method of forming a pattern according to the present invention, during the process for conducting etching using the pattern formed on the substrate as a mask, by forming a coating layer on the pattern surface using the film-forming material of the present invention, the etching resistance of the pattern can be improved.

Because the film formed using the film-forming material of the present invention exhibits a high etching selectivity ratio relative to the organic film, a pattern with a high aspect ratio is able to be formed using the above type of process that uses two or more layers, such as the aforementioned organic film and resist film.

Furthermore, according to the film-forming material of the present invention, pattern coating can be conducted at low temperature (a heat treatment may be used to form the coating film, or the coating film can be formed without conducting a heat treatment) using a simple method, and consequently the method of forming a pattern according to the present invention yields improved production efficiency as well as cost reductions, and can also be applied to patterns formed from various materials.

EXAMPLES

Example 1

A commercially available organic film-forming material (product name: ARC-29, manufactured by Brewer Science Ltd.) was applied to an 8-inch silicon substrate, and was then heated at 215° C. for 90 seconds to form an organic film (BARC) with a film thickness of 77 nm.

Subsequently, a resist composition was prepared by dissolving 100 parts by weight of a resin represented by a general formula shown below (Mw=10,000, Mw/Mn=2.0), 3.5 parts by weight of triphenylsulfonium nonafluorobutanesulfonate and 0.1 parts by weight of triethanolamine in 900 parts by weight of a mixed solvent of PGMEA and EL (with a weight ratio of 6:4).

[Formula 22]

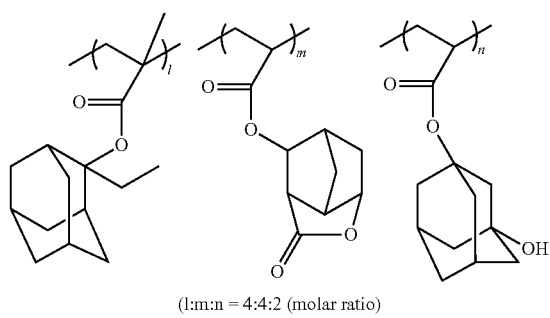

(l:m:n = 4:4:2 (molar ratio))

This resist composition was spin coated onto the organic film described above, and was then prebaked at 105° C. for 90 seconds, thereby forming a resist film. This resist film was then selectively irradiated through a mask, using an ArF excimer laser exposure apparatus NSR—S302 manufactured by Nikon Corporation (NA=0.60, σ=0.75).

A post exposure baking (PEB) treatment was then conducted at 90° C. for 90 seconds, and the resist film was then developed for 60 seconds using a 2.38% by weight aqueous solution of tetramethylammonium hydroxide, thereby forming a resist pattern (a hole pattern with dimensions (diameter): 160 nm, height: 300 μm) within the resist film.

In a separate preparation, tetraisocyanatosilane (Si(NCO)$_4$) was dissolved in sufficient p-menthane to generate a solution of 100 mM, thus yielding a film-forming material.

This film-forming material was applied uniformly by spin coating (10 seconds at 100 rpm) to the surface of the above resist pattern, washing was conducted using p-menthane (10 seconds at 500 rpm), and spin drying was then conducted at 2,000 rpm for 10 seconds, and then at 3,000 rpm for 10 seconds.

As a result, a uniform coating layer (a silicon oxide film (SiO$_2$)) was formed on the surface of the resist pattern. This coating layer was an ultra thin film with a film thickness of approximately 1 nm.

Subsequently, using the resist pattern with the coating layer formed thereon as a mask, etching (oxygen plasma etching) was conducted using a RIE (reactive ion etching) apparatus RIE-10NR (a product name, manufactured by Samco, Inc.) under the etching conditions described below, thereby etching the organic film (BARC).

[Etching Conditions]
Gas: oxygen gas.
Gas flow rate: 30 sccm ("sccm" represents the value measured at 1 atm (atmospheric pressure, or 1,013 hPa) at 23° C.)
Pressure inside chamber: 40 Pa.
Power output (electrical power) applied in order to generate plasma: 300 W.
Treatment time: 20 seconds.

As a result, the shape of the resist pattern following etching was substantially unchanged from that prior to etching. Moreover, the organic film (BARC) beneath the hole portions of the resist pattern was etched in a substantially uniform manner.

Comparative Example 1

With the exception of replacing the p-menthane of the film-forming material of the example 1 with cumene (boiling point: approximately 152° C.), testing was conducted in the same manner as the example 1.

As a result, the shape of the resist pattern following etching was substantially unchanged from that prior to etching. However, the organic film (BARC) was not etched.

Comparative Example 2

With the exception of replacing the p-menthane of the film-forming material of the example 1 with n-heptane (boiling point: approximately 98° C.), testing was conducted in the same manner as the example 1.

As a result, the shape of the resist pattern following etching was substantially unchanged from that prior to etching. However, the organic film (BARC) was not etched.

Comparative Example 3

With the exception of not coating the pattern with the film-forming material, testing was conducted in the same manner as the example 1.

As a result, the resist pattern almost completely disappeared during the etching process.

Comparative Example 4

With the exception of replacing the p-menthane of the film-forming material of the example 1 with limonene (boiling point: approximately 176° C.) represented by the chemical formula shown below, testing was conducted in the same manner as the example 1.

As a result, the tetraisocyanatosilane (Si(NCO)$_4$) reacted with the limonene and generated a precipitate, meaning a film-forming material could not be prepared.

[Formula 23]

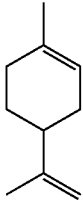

Comparative Example 5

With the exception of replacing the p-menthane of the film-forming material of the example 1 with α-pinene (boiling point: approximately 156° C.) represented by the chemical formula shown below, testing was conducted in the same manner as the example 1.

As a result, the tetraisocyanatosilane (Si(NCO)$_4$) reacted with the α-pinene and generated a precipitate, meaning a film-forming material could not be prepared.

[Formula 24]

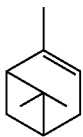

In this manner, by using the film-forming material of the present invention, etching of the organic film was able to be conducted with favorable retention of the resist pattern shape prior to etching. The above results confirmed that by using the film-forming material of the present invention, a film could be formed, at a low temperature at the level of room temperature, that exhibited a high degree of etching resistance and a high etching selectivity ratio relative to the organic film.

INDUSTRIAL APPLICABILITY

According to the present invention, a film-forming material and a method of forming a pattern that uses the film-forming material can be provided that are capable of forming, at low temperature, a film having a high degree of etching resistance and a high etching selectivity ratio relative to an organic film. Accordingly, the present invention is extremely useful industrially.

The invention claimed is:

1. A film-forming material, comprising a compound (W) capable of generating a hydroxyl group upon hydrolysis, and a solvent (S) in which said compound (W) is dissolved, wherein said compound (W) is a compound of titanium, zirconium, aluminum, niobium, silicon, boron, lanthanide, yttrium, barium, cobalt, iron, tantalum, germanium, antimony, selenium, or tellurium, and said solvent (S) comprises a terpene solvent (S1) with a boiling point of at least 155° C. that contains no functional groups that react with said compound (W), and wherein the terpene solvent (S1) is p-menthane, o-menthane, m-menthane or pinane.

2. A film-forming material according to claim 1, wherein said solvent (S1) is p-menthane.

3. A film-forming material according to claim 1, wherein said compound (W) is a silicon compound comprising two or more isocyanate groups and/or halogen atoms.

4. A method of forming a pattern comprising the steps of:
coating a pattern, which has been formed on top of an organic film of a laminate that comprises a substrate and said organic film, using a film-forming material according to claim 1, and
conducting etching of said organic film using, as a mask, said pattern that has been coated using said film-forming material.

5. A method of forming a pattern according to claim 4, wherein said etching is oxygen plasma etching or etching that uses CF$_4$ gas or CHF$_3$ gas.

6. A method of forming a pattern according to claim 4, wherein said pattern is a resist pattern.

* * * * *

UNITED STATES PATENT AND TRADEMARK OFFICE
CERTIFICATE OF CORRECTION

| | | |
|---|---|---|
| PATENT NO. | : 8,101,013 B2 | Page 1 of 1 |
| APPLICATION NO. | : 11/997300 | |
| DATED | : January 24, 2012 | |
| INVENTOR(S) | : Shogo MatsuMaru et al. | |

It is certified that error appears in the above-identified patent and that said Letters Patent is hereby corrected as shown below:

Title page, Item 75, Column 1, Line 2, Under Inventors, Change "Shingenori" to --Shigenori--.

Column 1, Line 25, Before "pattern" insert --(--.

Column 17, Line 47, Before "was" insert --5--.

Column 27, Line 2, Change "1-methyladamnatoxymethyl" to --1-methyladamantoxymethyl--.

Column 30, Line 15, After ")," insert --α- --.

Column 40, Line 3, Change "μm)" to --nm)--.

Signed and Sealed this
Third Day of July, 2012

David J. Kappos
*Director of the United States Patent and Trademark Office*